(12) United States Patent
Shimanouchi

(10) Patent No.: US 9,343,382 B2
(45) Date of Patent: May 17, 2016

(54) ELECTRONIC DEVICE AND MANUFACTURING METHOD THEREOF

(71) Applicant: FUJITSU LIMITED, Kawasaki-shi, Kanagawa (JP)

(72) Inventor: Takeaki Shimanouchi, Akashi (JP)

(73) Assignee: FUJITSU LIMITED, Kawasaki (JP)

( * ) Notice: Subject to any disclaimer, the term of this patent is extended or adjusted under 35 U.S.C. 154(b) by 51 days.

(21) Appl. No.: 14/251,004

(22) Filed: Apr. 11, 2014

(65) Prior Publication Data

US 2014/0203424 A1   Jul. 24, 2014

Related U.S. Application Data

(63) Continuation of application No. PCT/JP2011/076962, filed on Nov. 22, 2011.

(51) Int. Cl.
| | |
|---|---|
| *H01L 23/10* | (2006.01) |
| *H01L 23/04* | (2006.01) |
| *H03H 9/10* | (2006.01) |
| *B23K 1/00* | (2006.01) |
| *B81B 7/00* | (2006.01) |
| *B81C 1/00* | (2006.01) |
| *H01L 23/00* | (2006.01) |
| *H01L 21/50* | (2006.01) |
| *H03H 3/007* | (2006.01) |

(52) U.S. Cl.
CPC .............. *H01L 23/04* (2013.01); *B23K 1/0016* (2013.01); *B81B 7/0041* (2013.01); *B81C 1/00873* (2013.01); *H01L 24/94* (2013.01); *H03H 9/1057* (2013.01); *B23K 2201/42* (2013.01); *B81B 2201/014* (2013.01); *H01L 21/50* (2013.01); *H01L 23/10* (2013.01); *H01L 2924/1461* (2013.01); *H03H 3/0072* (2013.01)

(58) Field of Classification Search
CPC ............................... H01L 24/94; H01L 21/50
See application file for complete search history.

(56) References Cited

U.S. PATENT DOCUMENTS

| | | | | |
|---|---|---|---|---|
| 6,777,263 | B1 * | 8/2004 | Gan ................. | B81C 1/00269 257/417 |
| 8,604,576 | B2 * | 12/2013 | Oganesian ........ | H01L 27/14618 257/432 |
| 2006/0267210 | A1 | 11/2006 | Yamano et al. | |

(Continued)

FOREIGN PATENT DOCUMENTS

| | | |
|---|---|---|
| JP | 11-150201 | 6/1999 |
| JP | 11-340350 | 12/1999 |

(Continued)

OTHER PUBLICATIONS

JPOA—Office Action mailed on Aug. 25, 2015 issued with respect to the corresponding Japanese Patent Application No. 2013-545705, with partial English translated office action.

(Continued)

*Primary Examiner* — Matthew W Such
*Assistant Examiner* — Krista Soderholm
(74) *Attorney, Agent, or Firm* — Fujitsu Patent Center

(57) ABSTRACT

An electronic device includes a substrate; an element configured to be formed on the substrate; a sidewall member configured to enclose the element on the substrate; a cover member configured to be disposed on the sidewall member, and to partition a space around the element along with the sidewall member on the substrate; and a seal member configured to be disposed outside of the sidewall member, to bond the sidewall member and the cover member to a surface of the substrate, and to seal the space.

14 Claims, 34 Drawing Sheets

(56) References Cited

U.S. PATENT DOCUMENTS

| | | | | |
|---|---|---|---|---|
| 2007/0190747 A1* | 8/2007 | Humpston | ......... | B81C 1/00285 438/460 |
| 2009/0212657 A1* | 8/2009 | Mizuno | ................. | H02N 13/00 310/300 |
| 2011/0303992 A1* | 12/2011 | Okumura | ............. | B81B 7/0051 257/415 |
| 2012/0248615 A1* | 10/2012 | Chien | ................... | B81C 1/0023 257/770 |

FOREIGN PATENT DOCUMENTS

| | | |
|---|---|---|
| JP | 2002-231919 | 8/2002 |
| JP | 2006-013330 | 1/2006 |
| JP | 2006-074291 | 3/2006 |
| JP | 2007-013573 | 1/2007 |
| JP | 2009-107041 | 5/2009 |

OTHER PUBLICATIONS

International Search Report, mailed in connection with PCT/JP2011/076962 and mailed Jan. 31, 2012.

CNOA—Office Action mailed on Feb. 1, 2016 issued with respect to the corresponding Chinese Patent Application No. 201180074343.7 with full English translation. ** All references cited in the above listed CNOA were previously submitted in the Ids filed on Apr. 11, 2014.

* cited by examiner

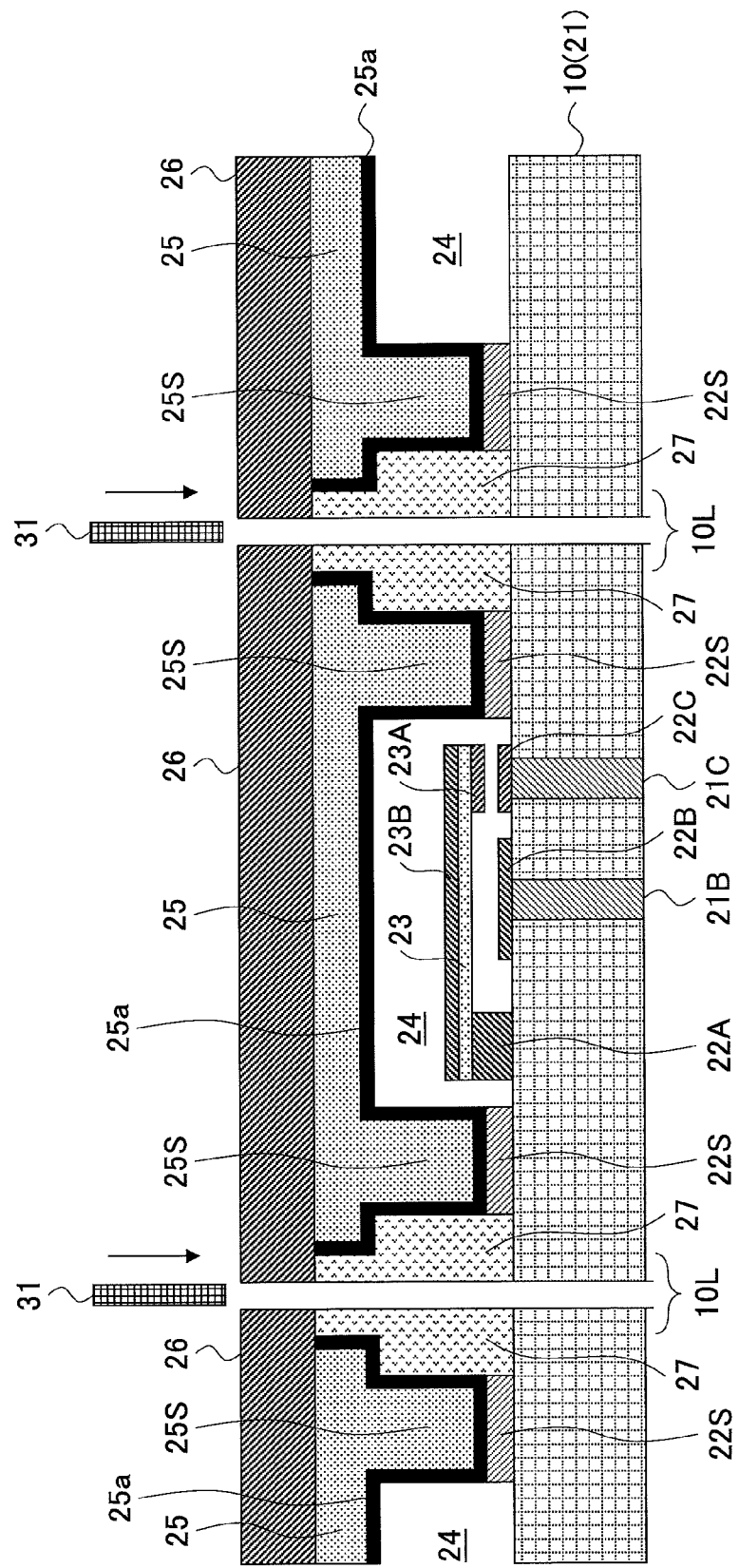

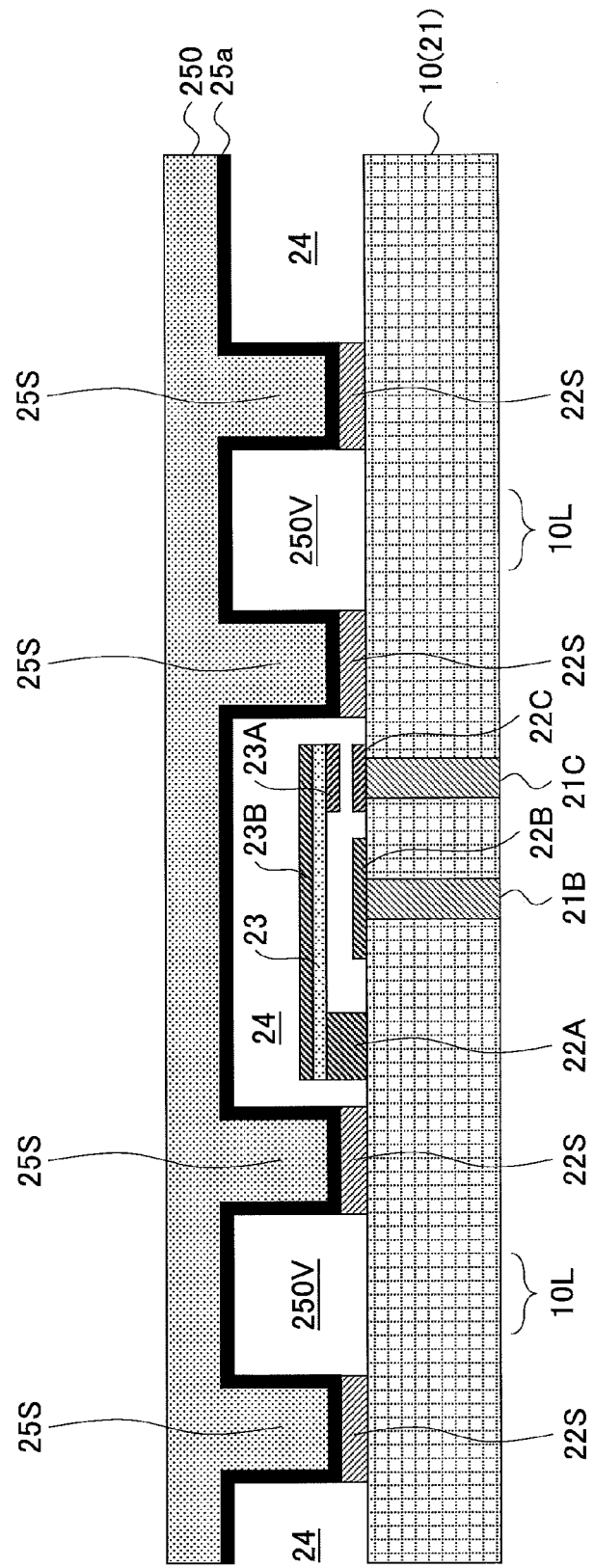

ELECTRONIC DEVICE AND MANUFACTURING METHOD THEREOF

CROSS-REFERENCE TO RELATED APPLICATIONS

This application is a continuation application of International Application PCT/JP2011/076962 filed on Nov. 22, 2011 and designated the U.S., the entire contents of which are incorporated herein by reference.

FIELD

The disclosures herein generally relate to an electronic device and a manufacturing method thereof.

BACKGROUND

The wafer-level package technology is a technology that collectively seals a number of elements formed on a semiconductor wafer before partitioning the semiconductor wafer into individual chips, and is widely used for manufacturing small semiconductor devices because the cost is low and it can form electronic elements with their respective sizes.

On the other hand, attempts have been made recently for collectively forming electronic devices on a wafer that have movable parts such as switches, variable-capacitance capacitors, crystal oscillators, and the like. Thereupon, there has been demand for the wafer-level package technology to be used for sealing these electronic devices to make the electronic devices smaller and to reduce the manufacturing cost.

For example, if an electronic device has a movable part, and an element corresponding to the electronic device formed on a wafer is to be sealed on the wafer, it is desirable that the element be covered by a cover member on the wafer so that a space is partitioned around the element by the cover member on the wafer.

For example, Patent Document 1 discloses a method of sealing an element by forming an element at a concave part on a surface of a wafer, and bonding a cover member to the surface of the wafer by a wax material so that the element is sealed. Also, in Patent Document 2, a cover member is bonded by a wax material layer to an upper surface of a sidewall member forming the circumference that is formed to surround an element on a wafer so that the element is sealed.

When a cover member is bonded by a wax material layer to a surface or an upper surface of an external sidewall member on the surface of a wafer as described above, the wax material layer needs to be melted, and it is preferable to press the cover member lightly so that the melted wax material layer levels out concavities and convexities on the surface of the substrate and the surface of the cover member to obtain secure sealing. However, there is a risk in applying pressure to the melted wax material layer that the wax material is flowed out or pushed out into the space around the element. If the flowed-out wax material contacts the element, it not only entails an electrical defect, but also hinders operation of a movable part of the element if there are any.

Thereupon, considering such inflowing of a wax material, the dimensions of the space are set larger than required conventionally, which makes the dimensions of the electronic device increase.

PATENT DOCUMENTS

[Patent Document 1] Japanese Laid-open Patent Publication No. 11-340350

[Patent Document 2] Japanese Laid-open Patent Publication No. 2006-74291

SUMMARY

According to at least an embodiment of the present invention, an electronic device includes a substrate; an element configured to be formed on the substrate; a sidewall member configured to enclose the element on the substrate; a cover member configured to be disposed on the sidewall member, and to partition a space around the element along with the sidewall member on the substrate; and a seal member configured to be disposed outside of the sidewall member, to bond the sidewall member and the cover member to a surface of the substrate, and to seal the space.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF DRAWINGS

FIG. 9D is a fourth process cross-sectional view illustrating the wafer level packaging according to the first embodiment;

FIG. 10A is another first process cross-sectional view illustrating the wafer level packaging according to the first embodiment;

DESCRIPTION OF EMBODIMENTS

First Embodiment

Figure 1:
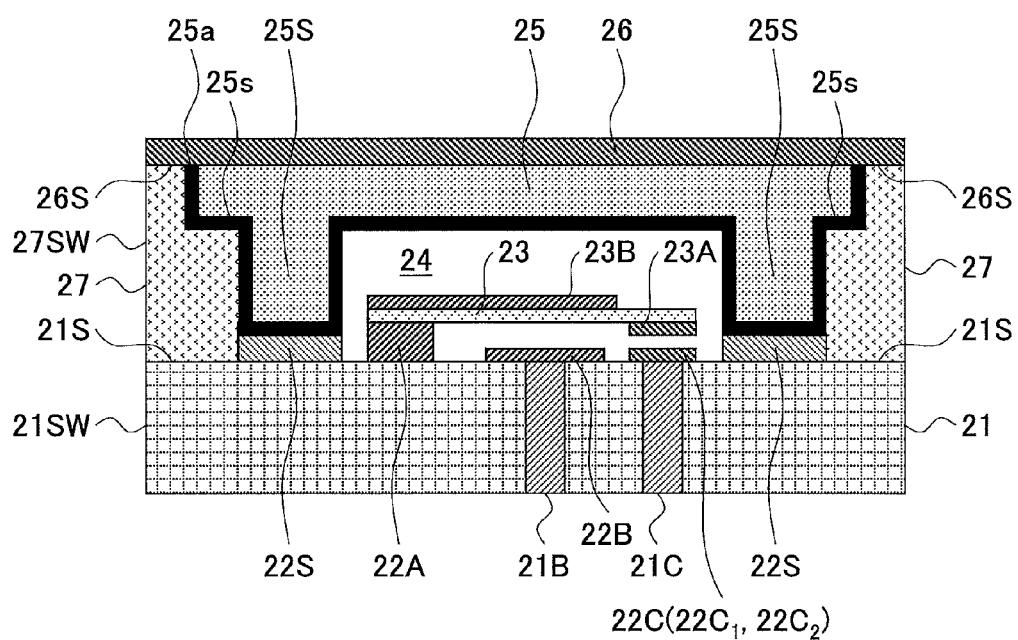
FIG. 1 is a cross-sectional view illustrating a configuration of a MEMS switch according to a first embodiment.
Figure 2:
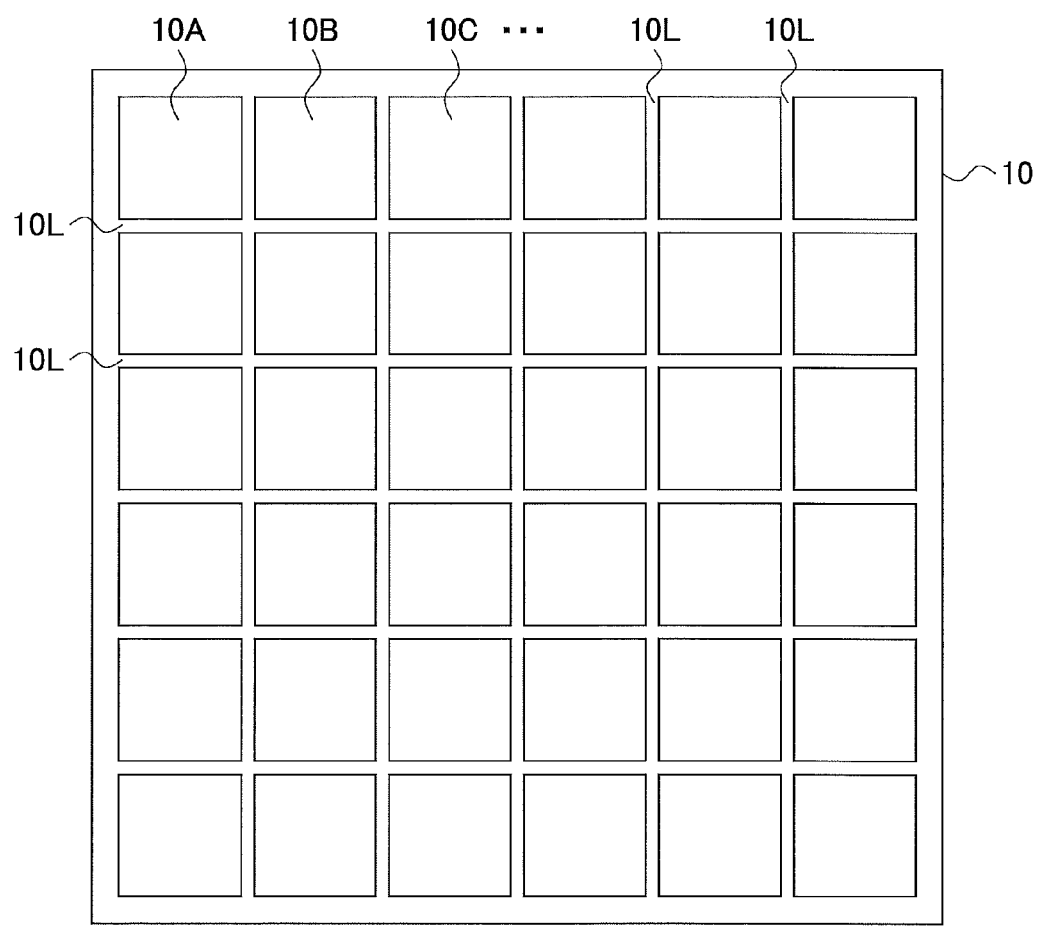
FIG. 2 is a plan view illustrating a number of MEMS switches in FIG. 1 formed on a wafer.

FIG. 1 is a cross-sectional view illustrating an example of an electronic device 20 according to the first embodiment, and FIG. 2 is a plan view of a wafer 10 from which the electronic devices 20 of FIG. 1 are to be cut off.

First, referring to the plan view of FIG. 2, the wafer 10 has a plane shape of, for example, a square on which multiple electronic device elements 10A, 10B, 10C, etc., which correspond to the electronic devices 20, respectively, are formed in a matrix shape separated by scribe lines 10L. The electronic device 20 in FIG. 1 is obtained, for example, from one of the electronic device elements 10A, 10B, 10C, etc., formed on the wafer 10, by dicing along the scribe lines 10L. The wafer is made of, for example, low-temperature calcination ceramics (LTCC), or may be made of glass, resin, or a silicon substrate.

Next, referring to the cross-sectional view of FIG. 1, the electronic device 20 is a MEMS (micro-electromechanical system) switch formed on a substrate 21 that corresponds to the wafer 10 made of low-temperature calcination ceramics, and a cantilever 23 is formed on a surface 21S of the substrate 21 via a pillar 22A made of copper (Cu) or the like that supports a contact point 23A at the tip. On the surface 21S of the substrate 21, a contact point 22C is also formed that corresponds to the contact point 23A, and a drive electrode pattern 22B is also formed to drive the cantilever 23 by an electrostatic force. As will be described later, the contact point 22C is actually constituted with two contact points $22C_1$-$22C_2$. If the cantilever 23 is drawn to the drive electrode pattern 22B and the contact point 23A contacts the contact points $22C_1$-$22C_2$, for example, a high-frequency signal coming to the contact point $22C_1$ is output from the contact point $22C_2$ via the contact point 23A. In the following, the cross-sectional view of FIG. 1 is described assuming that the contact point 22C includes the contact points $22C_1$-$22C_2$.

The cantilever 23 is formed of, for example, a silicon dioxide film, on which an upper electrode pattern 23B is supported. Thereupon, by applying a drive voltage between the drive electrode pattern 22B and the upper electrode pattern 23B, the cantilever is driven by an electromagnetic force generated between the drive electrode pattern 22B and the upper electrode pattern 23B, which makes the contact point 23A contact or be separated from the contact point 22C.

Also, although not illustrated in the cross-sectional view of FIG. 1, an electrode pattern 22D is formed on the surface 21S of the substrate 21 for supplying power to the upper electrode pattern 23B on the cantilever 23 via a bonding wire. The main body of the MEMS switch 20 in FIG. 1 will be described in detail later with reference to a perspective view of FIG. 3.

In addition, corresponding to the electrode patterns 22B-22C, through via plugs 21B-21C are formed in the substrate 21, respectively. Although not illustrated in the cross-sectional view of FIG. 1, a similar through via plug is formed in the substrate 21, corresponding to the electrode pattern 22D.

In this example, the through via plugs 21B-21C, the pillar 22A, and the upper electrode pattern 23B are made of, for example, copper (Cu), and the drive electrode pattern 22B and the contact points 22C-23A are made of an oxidation-resistant metal, for example, gold (Au).

Further, a seal ring 22S having a ring shape is formed on the surface 21S of the substrate 21; is made of, for example, gold (Au), or a stack structure of gold/titanium (Au/Ti) or gold/chromium (Au/Cr); and continuously surrounds the pillar 22A, the electrode patterns 22B and 22D, the cantilever 23, and the contact point 22C.

A cover member 25 that is placed on the seal ring 22S is made of, for example, silicon; has a sidewall member 25S and a cover member 25C formed in a unified form; and partitions an operational space 24 in which the pillar 22A, the electrode patterns 22B-22D, the cantilever 23, the contact point 22C, and the like are accommodated on the upper surface 21S of the substrate 21. In the illustrated embodiment, the cover member 25 has an adhesion layer 25a formed on its surfaces except for the upper surface, namely the surface opposite to a surface facing the substrate 21. The adhesion layer 25a is made of, for example, a stack structure of gold/titanium or gold/chromium. The sidewall member 25S is bonded to the seal ring 22S via the adhesion layer 25a by placing the cover member 25 on the substrate 21 accordingly. Also, a shield layer 26 is bonded to the upper surface of the cover member 25, which is made of, for example, an iron-nickel alloy.

Further, at the outside of the sidewall member 25S, a seal member 27 that is formed of, for example, a tin-bismuth solder fills a space partitioned by the upper surface 21S of the substrate 21, the lower surface 26S of the shield layer 26, and the adhesion layer 25a covering the sidewall surface of the sidewall member 25S. It should be noted in the illustrated example that a step part is further formed on the sidewall member 25S that includes a surface 25s facing the upper surface 21S of the substrate 21, and the seal member 27 covers not only the sidewall surface of the sidewall member 25S of the cover member 25, but also the step part. Consequently, the shield layer 26 and the cover member 25 are tightly bonded to the upper surface 21S of the substrate 21 by the seal member 27.

It should also be noted that a dicing process is executed following wafer level packaging in the present embodiment, as will be described in detail later, and consequently, the seal member 27 has a sidewall surface 27SW that extends from a sidewall surface 21SW of the substrate 21.

According to the present embodiment, the seal member 27 is formed at the outside of the sidewall member 25S when viewing from the operational space 24. Therefore, if the cover member 25 is pressed to the substrate 21, for example, in a state where the seal member 27 is melted to accelerate bonding to the cover member 25 and the substrate 21, or bonding to the shield layer 26 and the substrate 21, the melted seal member 27 does not flow into the operational space 24. This makes it possible to realize tight and solid bonding between the seal ring 22S and the cover member 25 directly or via the seal member 27, and to eliminate a requirement on the dimensions of the space 24 to be set larger than required, which are preferable features.

Figure 3:
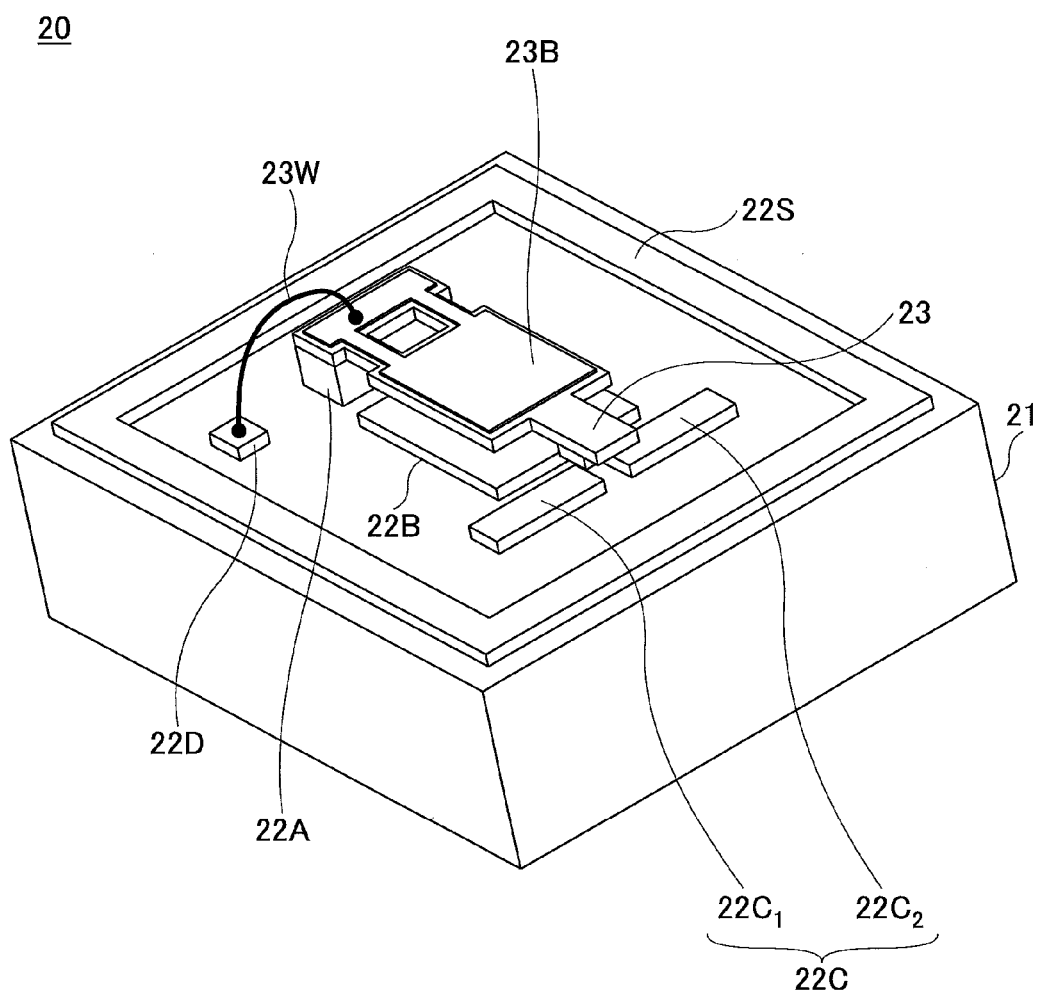
FIG. 3 is a perspective view illustrating a main body part of the MEMS switch in FIG. 1.

FIG. 3 is a perspective view illustrating the main body part of the MEMS switch 20 in detail in a state where the cover member 25, the shield layer 26, and the seal member 27 are removed.

Referring to FIG. 3, it can be seen that the electrode pattern 22D is formed in the neighborhood of the pillar 22A on the upper surface 21S of the substrate 21, and the electrode pattern 22D is connected with the upper electrode pattern 23B on the cantilever 23 by a bonding wire 23W. Also, as described earlier, a through electrode (not illustrated) is formed in the substrate 21 that corresponds to the electrode pattern 22D, similarly to the through electrode patterns 21B-21C.

Figure 4A:
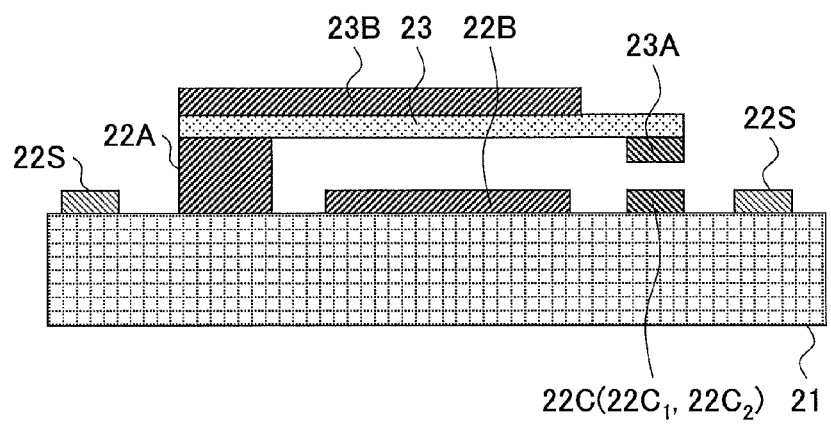
FIG. 4A is a schematic view illustrating a first operational state of the MEMS switch in FIG. 1.
Figure 4B:
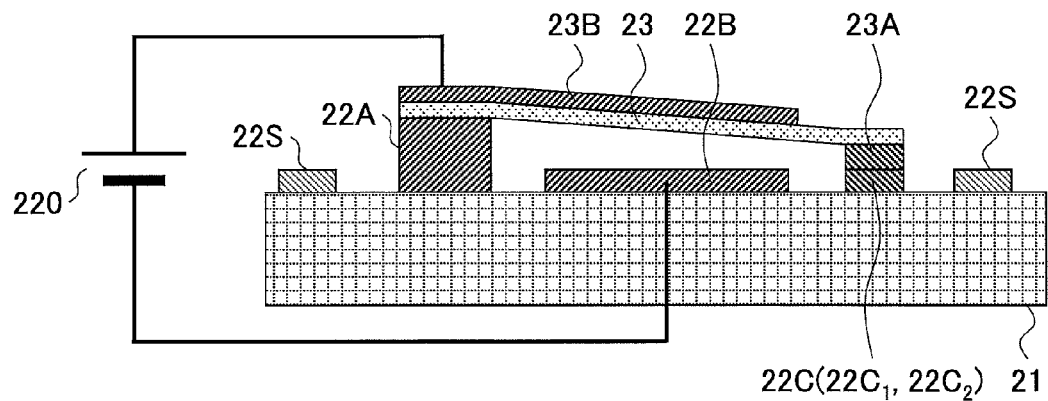
FIG. 4B is a schematic view illustrating a second operational state of the MEMS switch in FIG. 1.

In the configuration in FIG. 3, two contact points $22C_1$ and $22C_2$, which are formed corresponding to the contact point 22C, are non-conductive in a state where a drive voltage is not applied between the electrode patterns 22B and 23B as illustrated in FIG. 4A. The electrode patterns $22C_1$ and $22C_2$ are conductive in a state where a drive voltage is applied between the electrode patterns 22B and 23B as illustrated in FIG. 4B, which makes a high-frequency signal coming to the contact point $22C_1$ be output from the contact point $22C_2$ via the contact point 23A.

In the following, a manufacturing method of the MEMS switch 20 in FIG. 1 will be described.

First, manufacturing of the main body part of the MEMS switch 20 will be briefly described with reference to FIGS. 5A-5I.

Figure 5A:
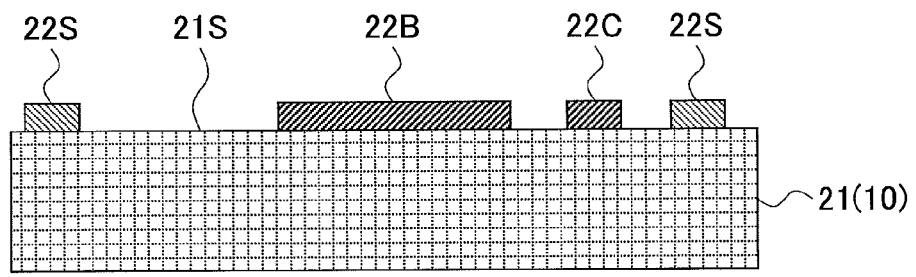
FIG. 5A is a schematic view illustrating a first process cross-sectional view of a forming process of the main body part of the MEMS switch in FIG. 1.

Referring to FIG. 5A, a seal ring 22S, a drive electrode pattern 22B, and contact points $22C_1$-$22C_2$ are first formed on the surface 21S of a substrate 21, which corresponds to the wafer 10 in FIG. 2, in each of the element forming regions 10A, 10B, 10C, etc., on the wafer 10, for example, by accumulating and patterning a gold film having the thickness of, for example, 1 μm. Here, the seal ring 22S is formed having the width of, for example, 150 μm along the scribe lines 10L that partition the element forming regions having the dimensions of, for example, 1500 μm by 1000 μm, respectively. As described earlier, the seal ring 22S is formed with a ring shape continuously surrounding the pillar 22A, the electrode patterns 22B-22D, the contact points $22C_1$-22C, and the like that are to be formed in the element forming region.

For example, the seal ring 22S, the drive electrode pattern 22B, and the contact points $22C_1$-$22C_2$ can be formed by forming a thin gold film (not illustrated) as a seed layer on the surface of the substrate 21, namely, the wafer 10, then, forming a photoresist film that has photoresist openings corresponding to the respective electrode patterns on the gold film, and applying an electrolytic plating method or the like using the photoresist film as a mask.

Figure 5B:
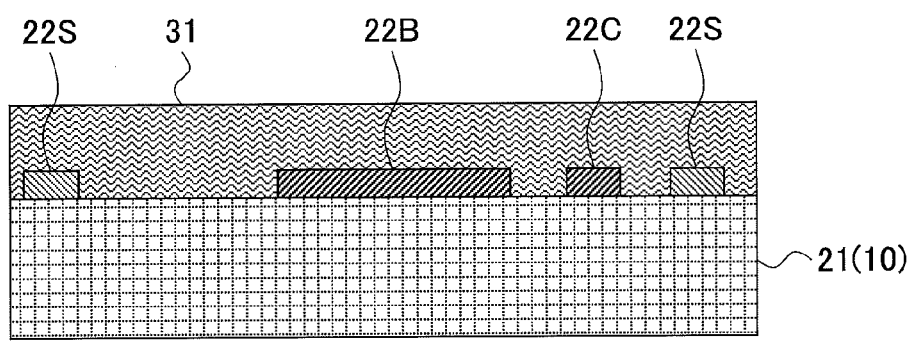
FIG. 5B is a schematic view illustrating a second process cross-sectional view of the forming process of the main body part of the MEMS switch in FIG. 1.
Figure 5C:
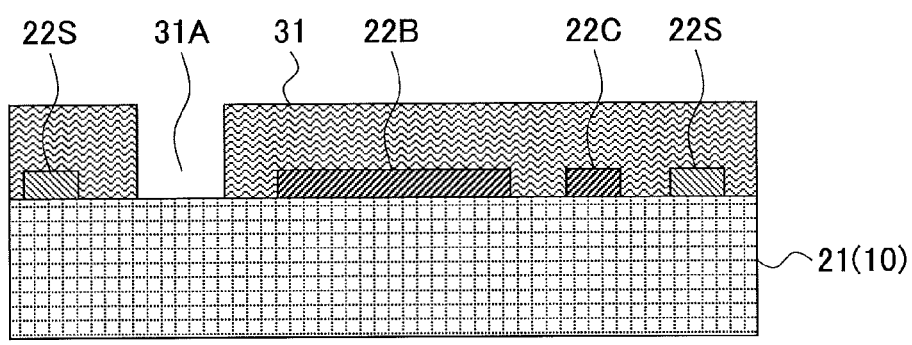
FIG. 5C is a schematic view illustrating a third process cross-sectional view of the forming process of the main body part of the MEMS switch in FIG. 1.

Next, as illustrated in FIG. 5B, a photoresist film 31 is formed on the substrate 21, covering the structure on the surface 21S. Further, as illustrated in FIG. 5C, an opening 31A is formed in the photoresist film 31 to expose a part of the surface 21S corresponding to the pillar 22A.

Figure 5D:
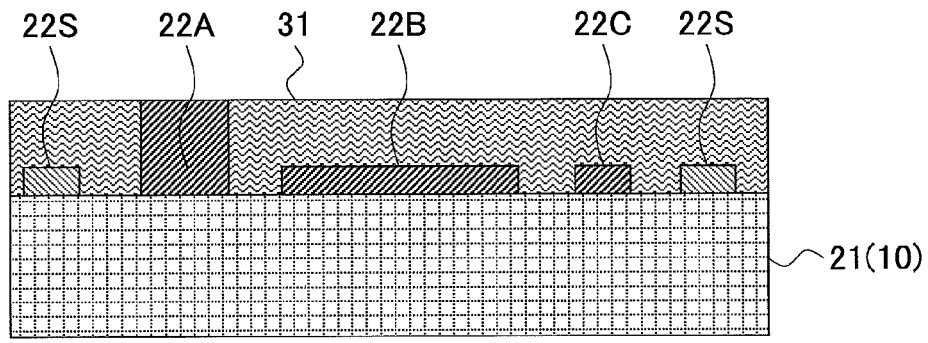
FIG. 5D is a schematic view illustrating a fourth process cross-sectional view of the forming process of the main body part of the MEMS switch in FIG. 1.

Further, by accumulating a copper layer at the opening 31A by, for example, an electrolytic plating method, a pillar 22A is formed having the height of, for example, 8 μm as illustrated in FIG. 5D. Here, when forming the pillar 22A or 22C by an electrolytic plating, the gold film can be used as a plating seed layer that has been formed on the surface of the wafer 10 at the process of FIG. 5A.

Figure 5E:
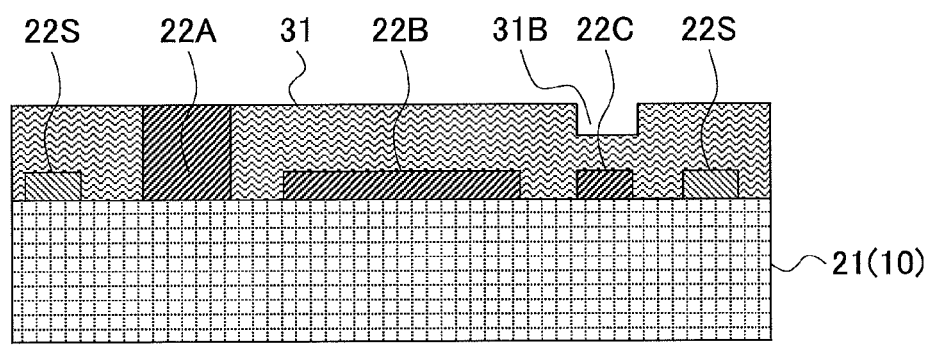
FIG. 5E is a schematic view illustrating a fifth process cross-sectional view of the forming process of the main body part of the MEMS switch in FIG. 1.
Figure 5F:
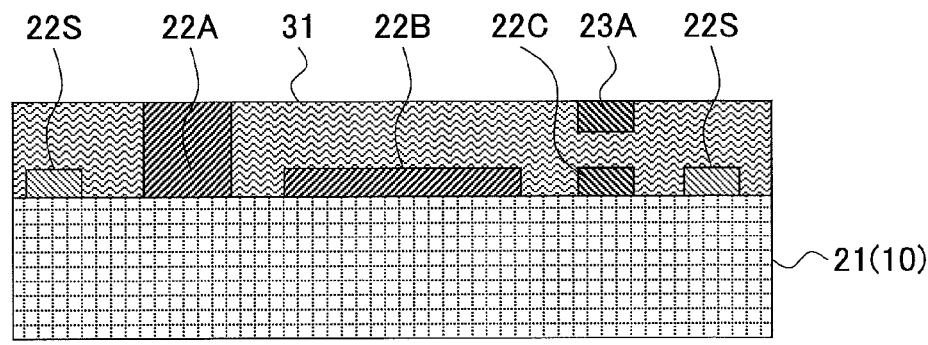
FIG. 5F is a schematic view illustrating a sixth process cross-sectional view of the forming process of the main body part of the MEMS switch in FIG. 1.

Further, as illustrated in FIG. 5E, an opening 31B for the contact point 23A is formed in the photoresist film 31 that corresponds to the contact points $22C_1$-$22C_2$, having a predetermined depth of, for example, 2 μm. Further, as illustrated in FIG. 5F, gold fills the opening 31B to form a pattern for the contact point 23A having the thickness of 2 μm.

Figure 5G:
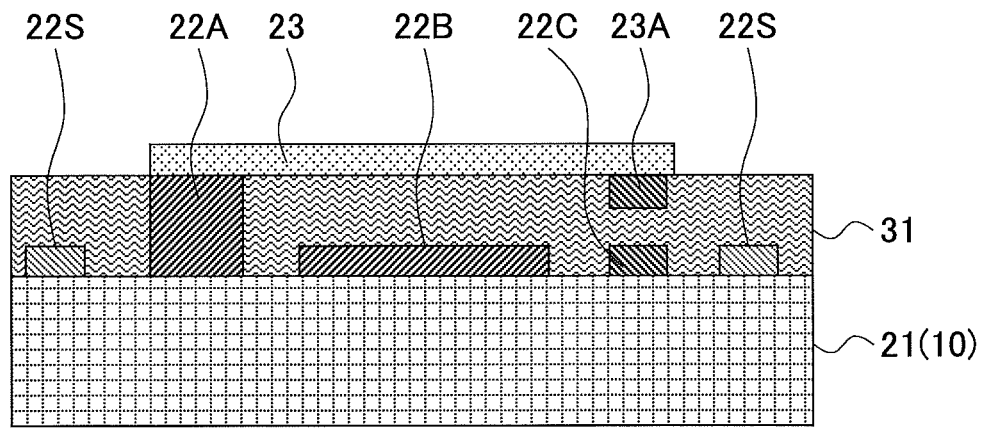
FIG. 5G is a schematic view illustrating a seventh process cross-sectional view of the forming process of the main body part of the MEMS switch in FIG. 1.
Figure 5H:
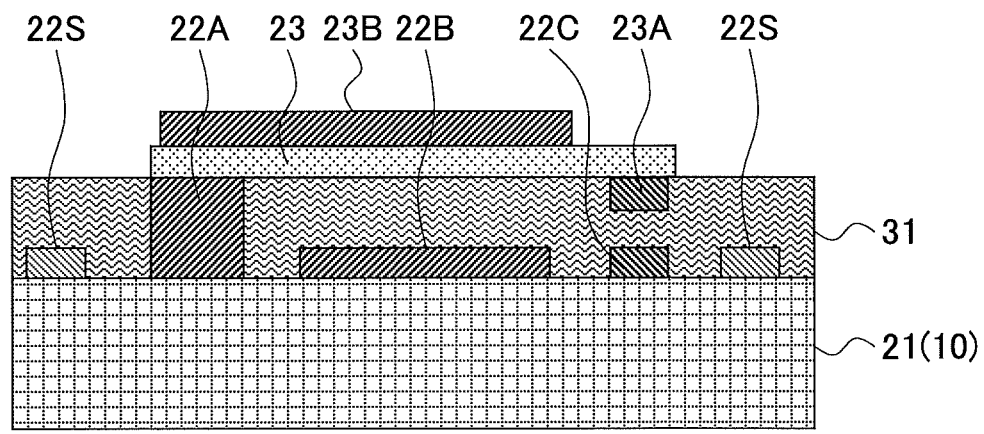
FIG. 5H is a schematic view illustrating an eighth process cross-sectional view of the forming process of the main body part of the MEMS switch in FIG. 1.

Further, as illustrated in FIG. 5G, a cantilever 23 is formed by a silicon dioxide film having the thickness of, for example, 5 μm so that it extends from the pillar 22A to the contact point 23A on the photoresist film 31. Further, as illustrated in FIG. 5H, an upper electrode pattern 23B is formed by a copper pattern having the thickness of, for example, 0.5 μm on the cantilever 23.

Figure 5I:
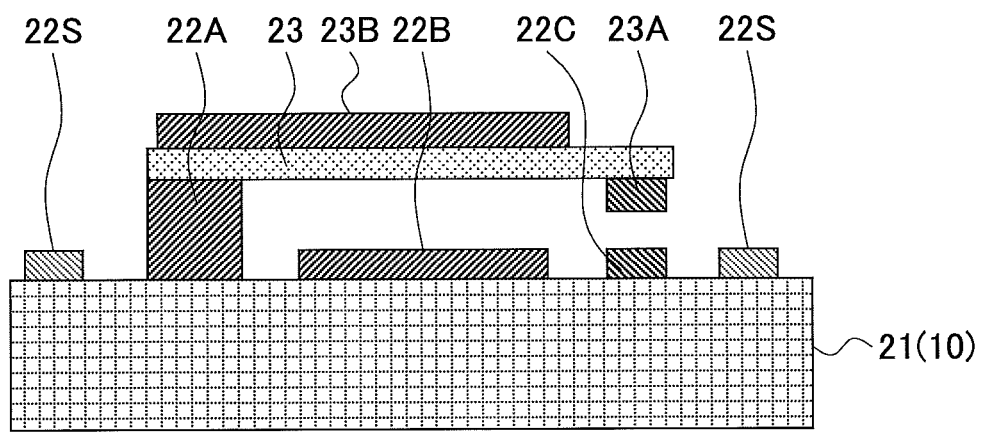
FIG. 5I is a schematic view illustrating a ninth process cross-sectional view of the forming process of the main body part of the MEMS switch in FIG. 1.

Further, the photoresist film 31 is removed by dissolving with a solvent or the like, or by asking in an oxygen atmosphere as illustrated in FIG. 5I, then the upper electrode pattern 23B is connected with an electrode pattern 22D (not illustrated in the cross-sectional view of FIG. 5I) via a bonding wire 22W as described with FIG. 3, and thus, the MEMS switch 20 is formed.

Also, the thin plating seed layer that has been formed and remains on the surface of the wafer 10 at the process of FIG. 5A is removed by wet etching at the process of FIG. 5I. Applying wet etching in this way has virtually no influence on the structure formed in the element forming region because the plating seed layer is extremely thin.

By the processes of FIGS. 5A-5I, the main body part of the MEMS switch 20 is formed in every one of the element forming regions 10A, 10B, 10C, etc., on the wafer 10 in FIG. 2, which is illustrated in the perspective view of FIG. 3.

Note that it is assumed that the through via plugs 21B-21C and the like have been already formed in the substrate 21 before the process of FIG. 5A.

Next, an overview of wafer level packaging will be described that is applied to the wafer 10 according to the first embodiment, with reference to an exploded perspective view in FIG. 6.

Figure 6:
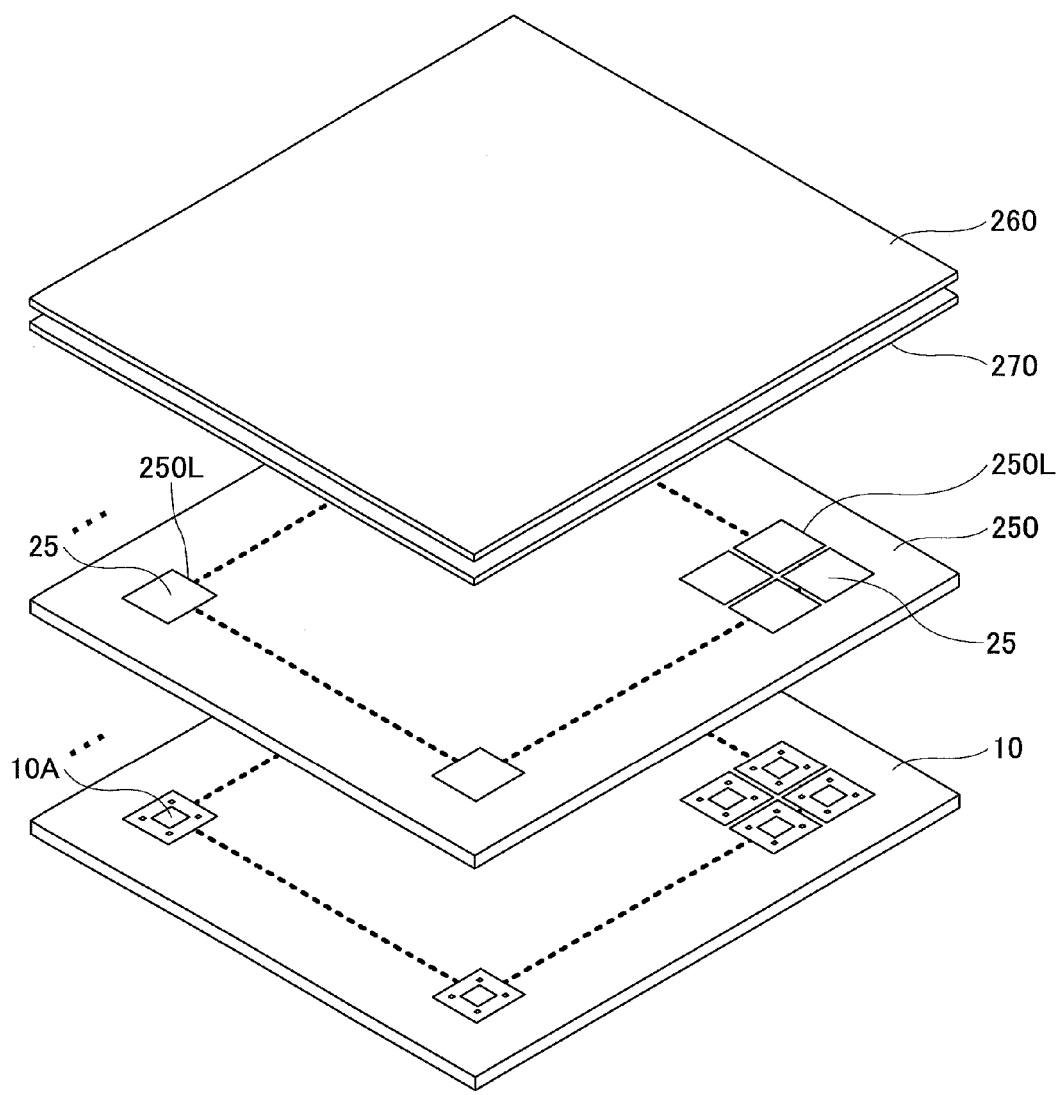
FIG. 6 is an exploded perspective view illustrating an overview of wafer level packaging according to the first embodiment.

Referring to FIG. 6, MEMS switches 20 illustrated in the perspective view of FIG. 3 are formed in respective element forming regions on the wafer 10, mutually separated in a matrix shape divided by the scribe lines 10L. A cap substrate 250 is bonded on the wafer 10 that is formed by bonding the cover members 25 in a matrix shape in accordance with the element forming regions on the wafer 10. Further, a shield substrate 260, which supports a seal layer 270 of molten solder or the like on its lower surface, is pressed on the cap substrate 250.

On the cap substrate 250, slit parts 250L corresponding to the scribe lines 10L on the wafer 10 are formed vertically and horizontally to enclose the cover members 25. By pressing the shield substrate 260 on the cap substrate 250 from above, the seal layer 270 flows through the slit parts 250L down into spaces below the cap substrate 250, and fills the spaces between a number of MEMS switches 20 formed on the wafer 10, which have the cross-sectional structures of FIG. 1.

Figure 7:
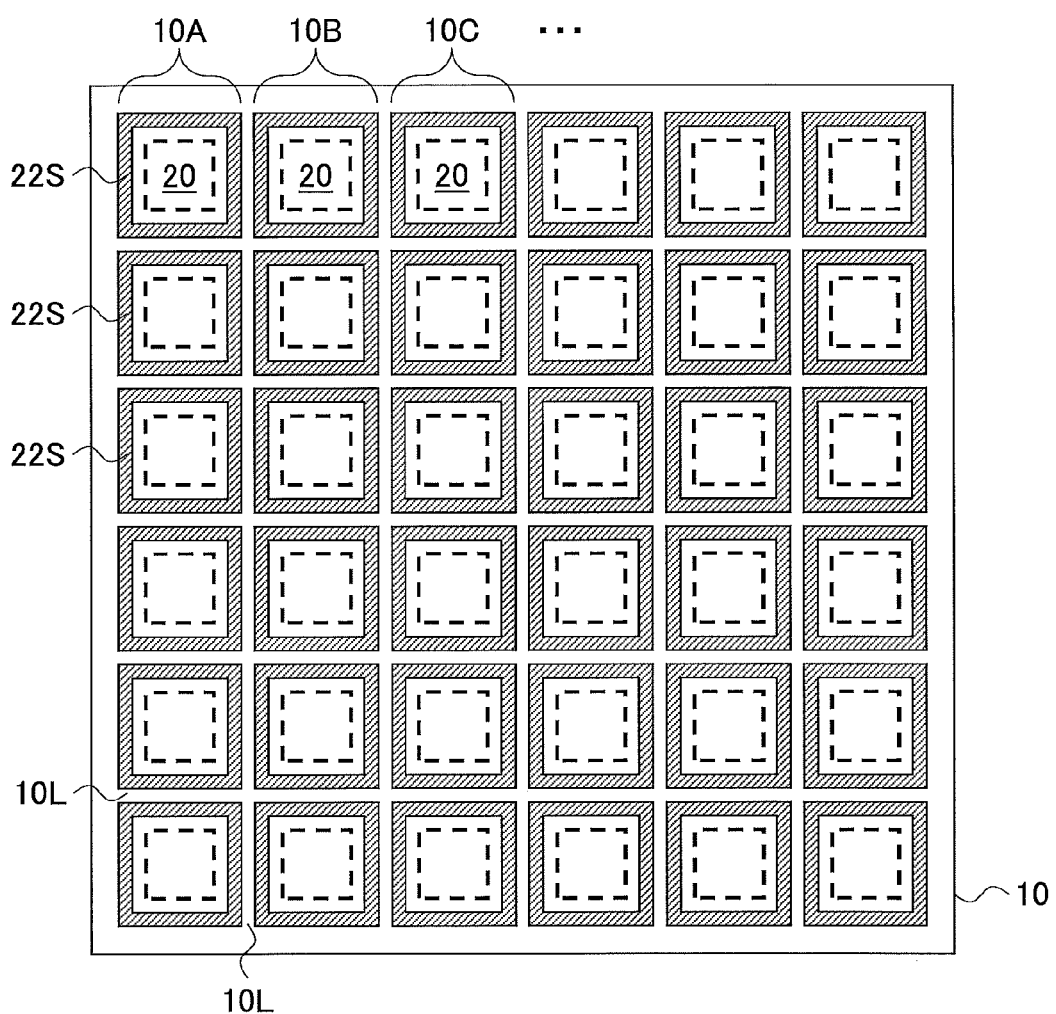
FIG. 7 is a plan view illustrating a wafer surface on which MEMS switches are formed.

FIG. 7 is a plan view of the wafer 10 in the exploded perspective view of FIG. 6.

Referring to FIG. 7, in accordance with the plan view of FIG. 2, the element forming regions 10A, 10B, 10C, etc., are partitioned on the wafer 10 by the scribe lines 10L having the width of, for example, 110 μm that extends vertically and horizontally. In each of the multiple element forming regions 10A, 10B, 10C, etc., a main body part of the MEMS switch 20 illustrated in the perspective view of FIG. 3 is formed enclosed by the seal ring 22S.

Figure 8A:
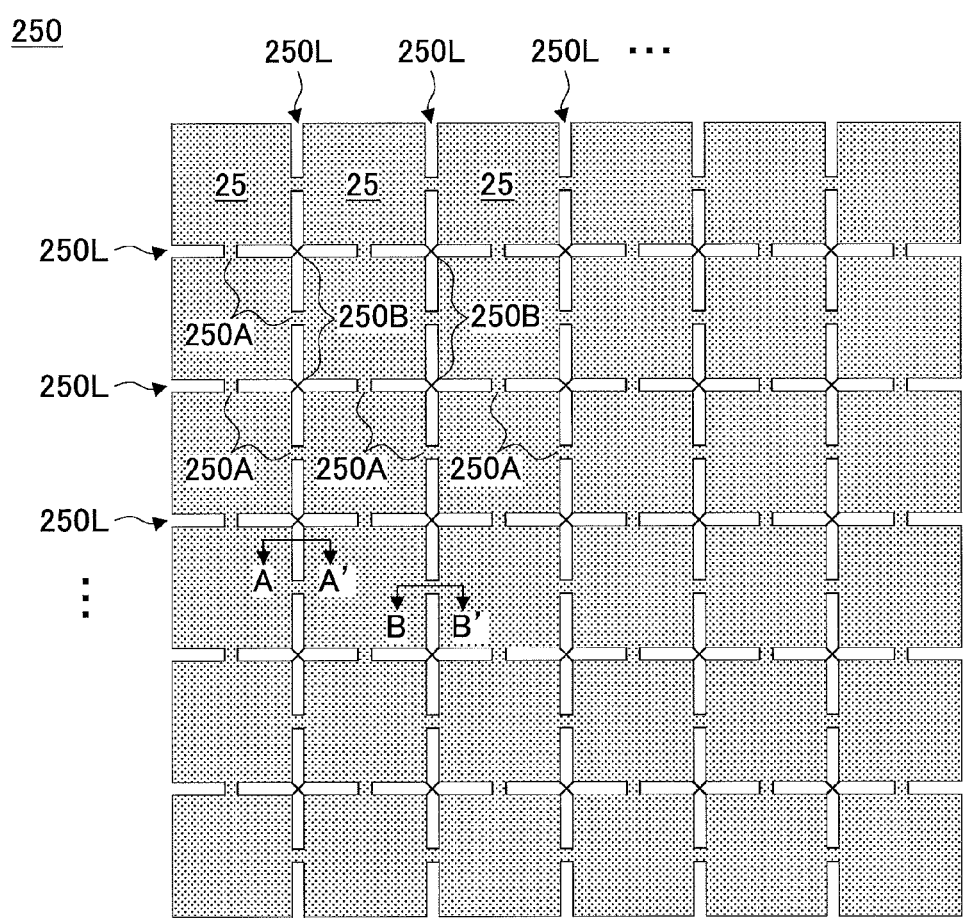
FIG. 8A is a plan view illustrating an upper surface of a cap substrate.
Figure 8B:
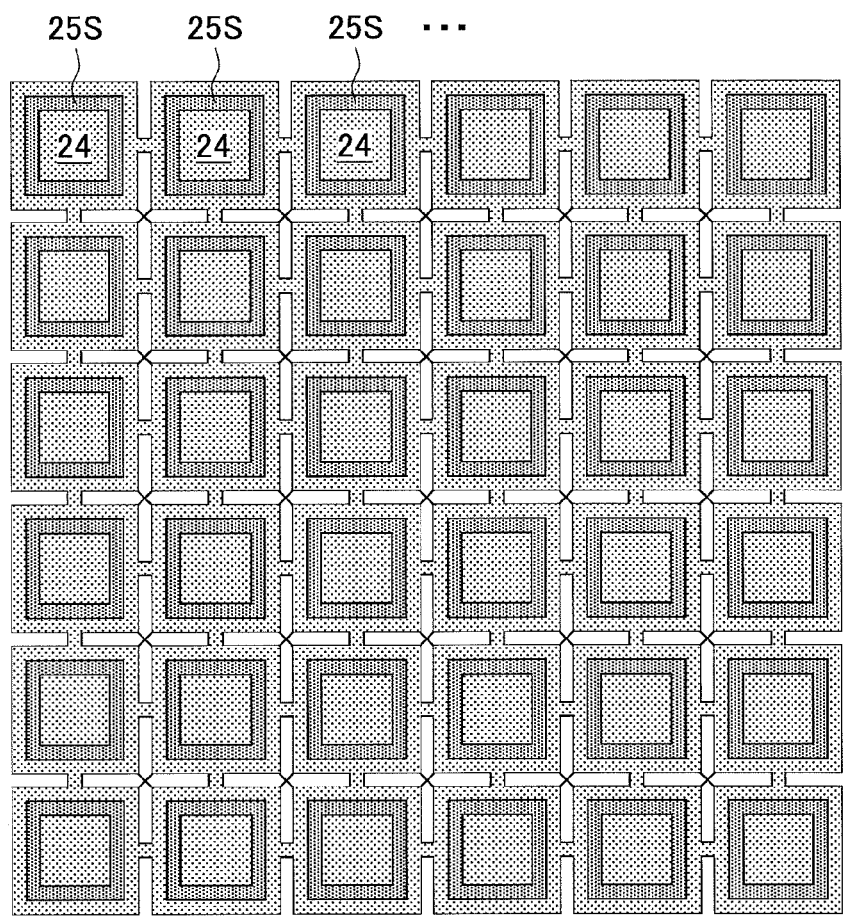
FIG. 8B is a plan view illustrating a lower surface of the cap substrate.

FIG. 8A is a plan view of the cap substrate 250 in the exploded perspective view of FIG. 6 that views the upper side, namely, the side facing the shield substrate 260 in FIG. 6, and FIG. 8B is a plan view of the cap substrate 250 in the exploded perspective view of FIG. 6 that views the lower side, namely, the side facing the wafer 10 in FIG. 6. By cutting off the wafer 10 along the scribe lines 10L, a substrate 21 is formed as in FIG. 1.

Referring to the plan view of FIG. 8A, in the silicon substrate forming the cap substrate 250, slit parts 250L extends vertically and horizontally corresponding to the scribe lines 10L on the wafer 10 to partition individual cover members 25. Also, the individual cover members 25 are mechanically connected with adjacent cover members 25 by rib-shaped bridge members 250A-250B. A bridge member 250A bonds a cover member 25 to its adjacent cover member 25 in a row direction or a column direction, and a bridge member 250B bonds a cover member 25 to its adjacent cover member 25 in an oblique direction.

Also, referring to the plan view of FIG. 8B, it can be seen that a sidewall member 25S is formed as a ring-shaped convex pattern in each of the element forming regions that surrounds a concave part, which corresponds to an operational space 24 in FIG. 1, on the lower surface of the silicon substrate that forms the cap substrate 250.

A manufacturing method of such a cap substrate 250 will be described later with reference to FIGS. 11A-11D.

Next, the wafer level packaging will be described in detail with reference to process cross-sectional views of FIGS. 9A-9D and FIGS. 10A-10D according to the present embodiment. Note that FIGS. 9A-9D are cross-sectional views taken along the line A-A' in FIG. 8A, and FIGS. 10A-10D are cross-sectional views taken along the line B-B' in FIG. 8A.

Figure 9A:
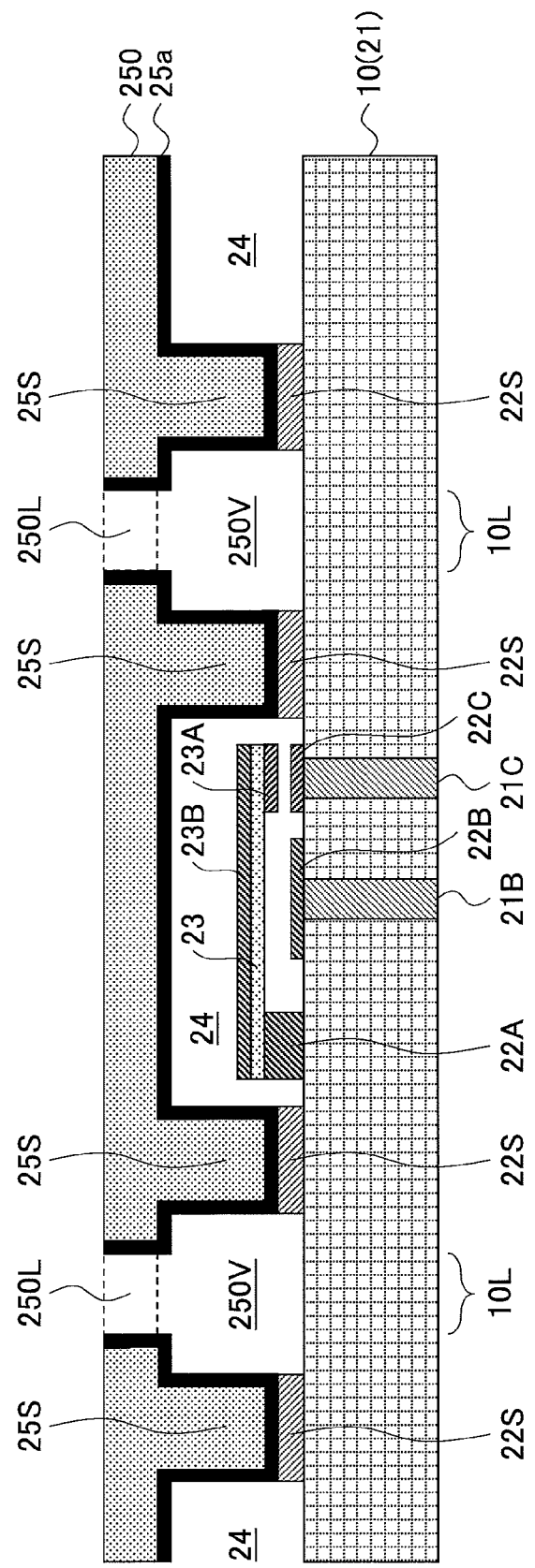
FIG. 9A is a first process cross-sectional view illustrating wafer level packaging according to the first embodiment.

Referring to FIG. 9A and FIG. 10A, the adhesion layer 25a is formed on the lower surface of the cap substrate 250, and the cap substrate 250 is disposed on the wafer 10 so that the sidewall members 25S contact the seal rings 22S via the adhesion layer 25a, respectively. Further, by pressing the cap substrate 250 to the wafer 10 with pressure of, for example, 1 MPa while heating at the temperature of, for example, 280° C., the sidewall members 25S are securely bonded to the seal rings 22S via the adhesion layer 25a even if there are some concavities and convexities on the surfaces of the sidewall members 25S and the seal rings 22S. By having the sidewall member 25S bonded to the seal ring 22S in each of the element forming regions 10A, 10B, 10C, etc., the operational space 24 is partitioned in each of the element forming regions 10A, 10B, 10C, etc., surrounded by the sidewall member 25S. Note that only the operational spaces 24 are illustrated and the main bodies of the MEMS switches 20 are omitted for element forming regions adjacent to the element forming region in the following description.

Figure 9B:
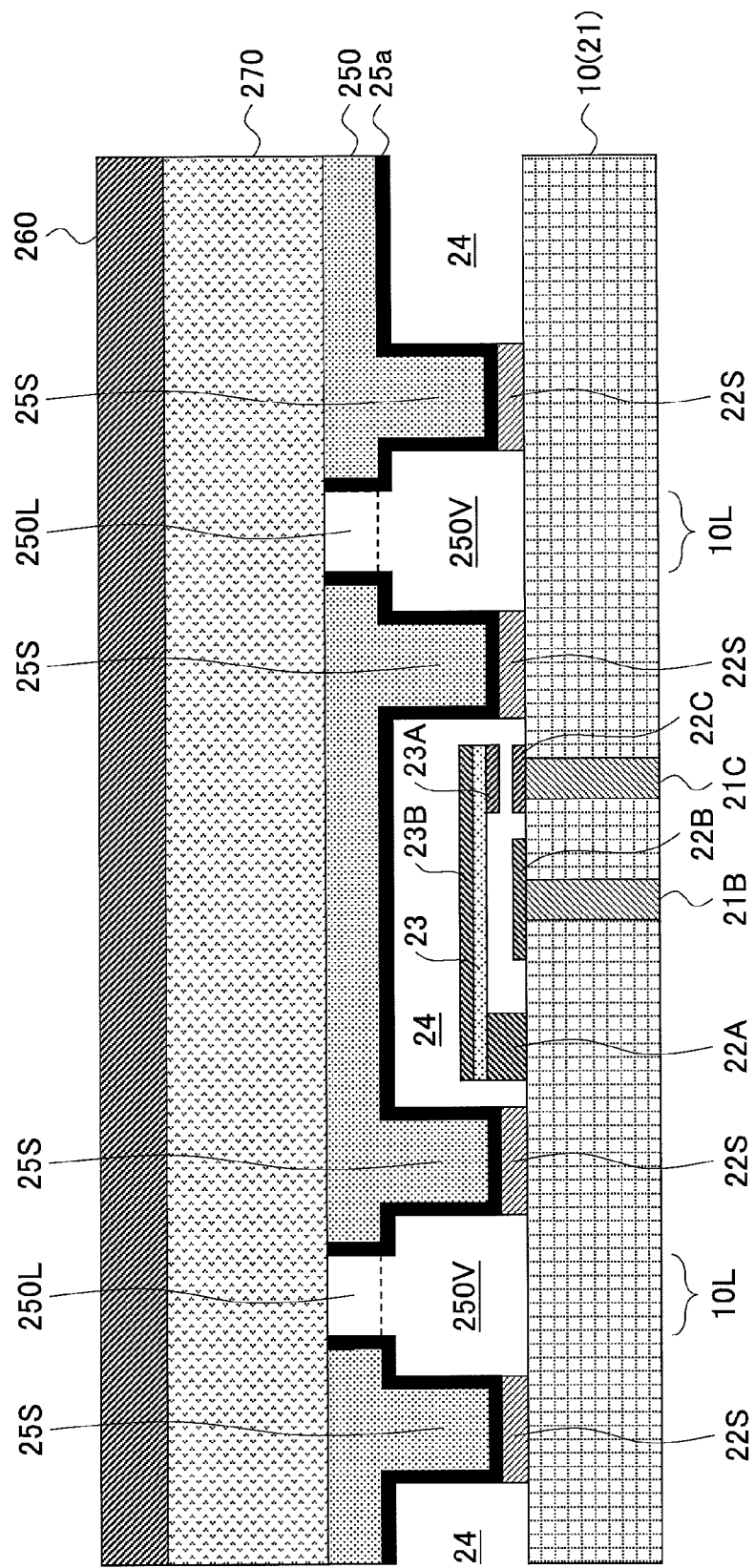
FIG. 9B is a second process cross-sectional view illustrating the wafer level packaging according to the first embodiment.
Figure 9C:
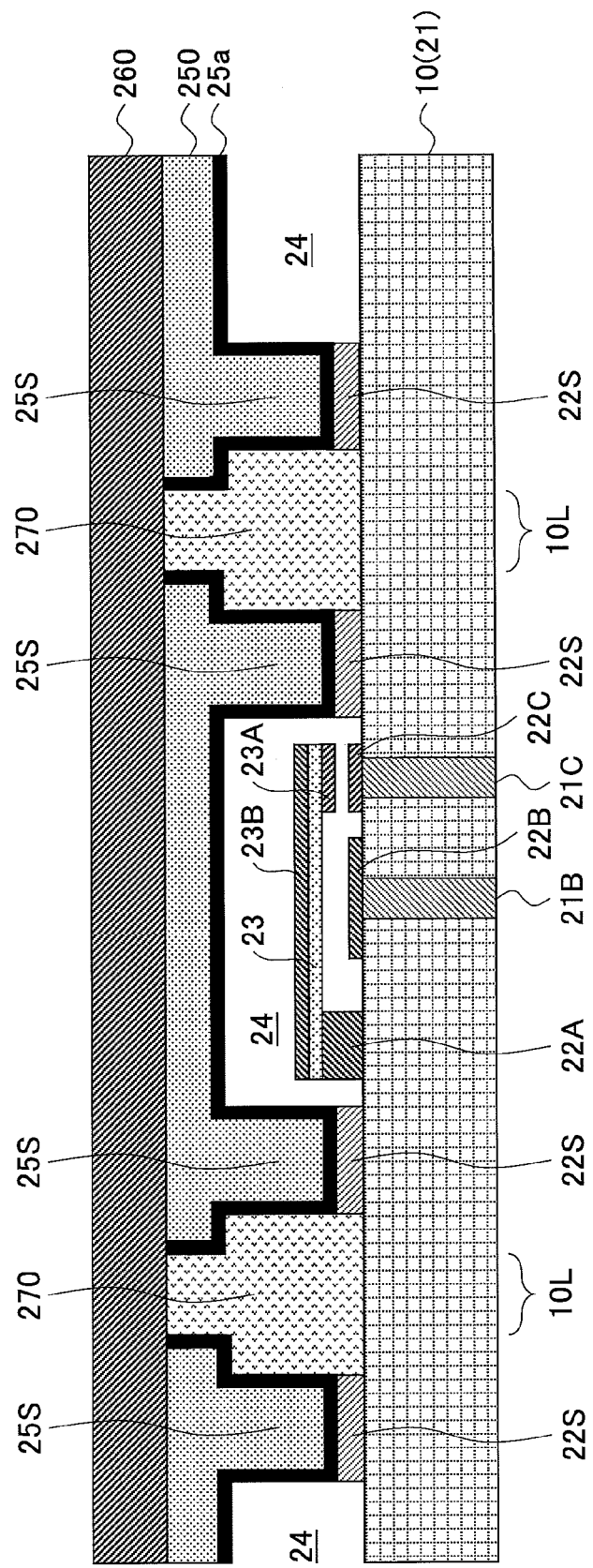
FIG. 9C is a third process cross-sectional view illustrating the wafer level packaging according to the first embodiment.
Figure 10B:
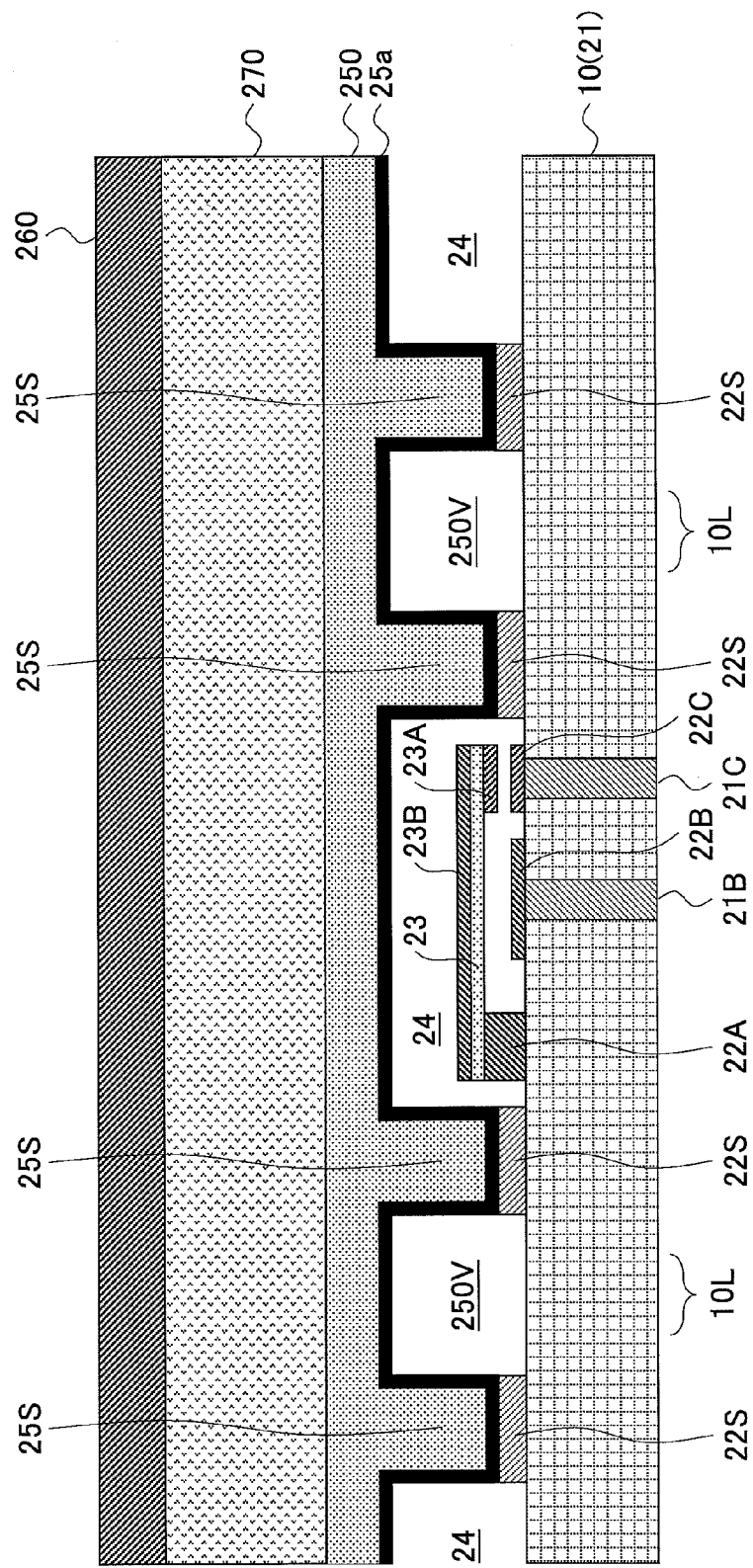
FIG. 10B is another second process cross-sectional view illustrating the wafer level packaging according to the first embodiment.
Figure 10C:
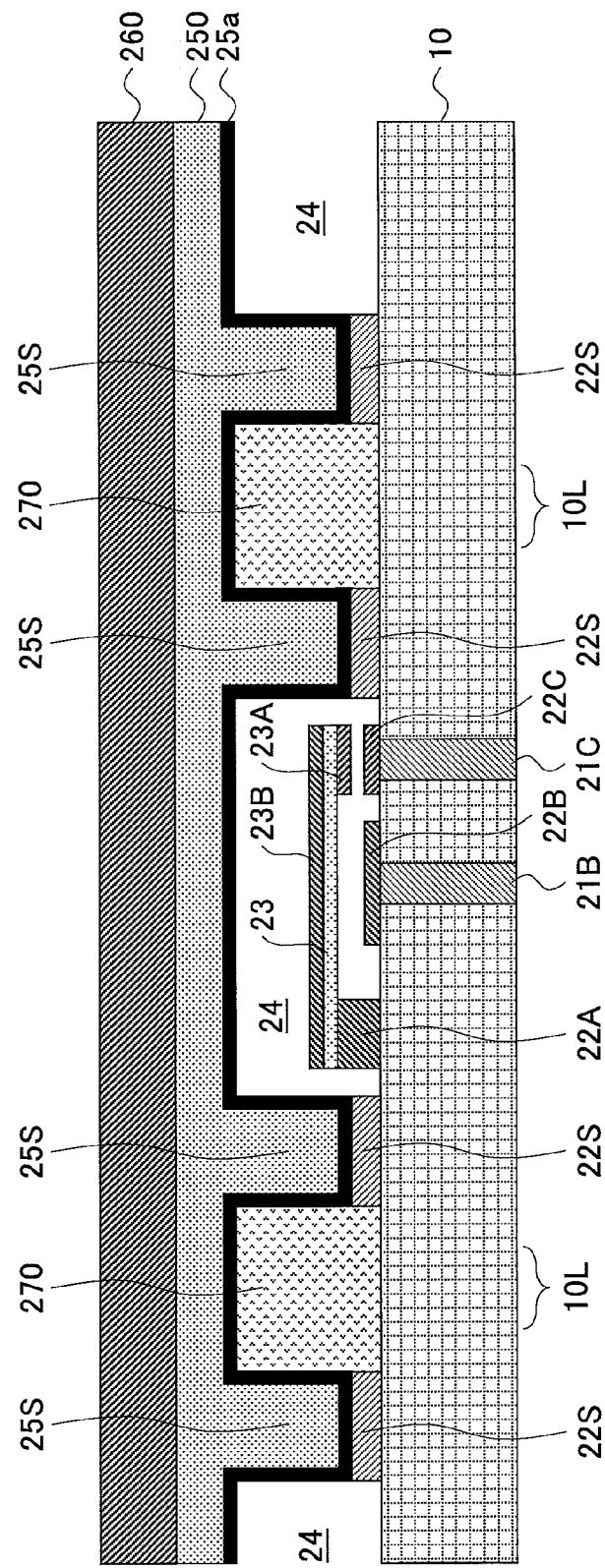
FIG. 10C is another third process cross-sectional view illustrating the wafer level packaging according to the first embodiment.

Next, as illustrated in FIG. 9B and FIG. 10B, the shield substrate 260 that supports the seal layer 270 on its lower surface is disposed on the structure of FIG. 9A. Further, as illustrated in FIG. 9C and FIG. 10C, the seal layer 270 is melted in an inert atmosphere, for example, a nitrogen atmosphere. Further, the shield substrate 260 is pressed in a direction designated by an arrow, with which the melted seal layer 270 is pushed out from the slit parts 250L into spaces 250V that are formed between the sidewall members 25S. Each of the spaces 250V is formed between an element forming region and its adjacent element forming region, corresponding to the scribe lines 10L. The spaces 250V communicate with each other on the wafer 10 as illustrated in the plan view of FIG. 8B, through which nitrogen gas and extra melted solder that have filled the spaces 250V are exhausted out of the wafer 10, and the melted seal layer 270 fills the spaces 250V.

In a state illustrated in FIG. 9C and FIG. 10C, the sidewall member 25S has been bonded to the seal ring 22S in each of the element forming regions. Consequently, the inert gas such as nitrogen gas fills up the operational space 24 that is hermetically closed, and the melted seal layer 270 does not flow into the operational space 24 even if the shield substrate 260 is pressed. Therefore, according to the present embodiment, the operational space 24 does not need to be set larger than required for the dimensions of the cantilever 23 and the like in the element forming region, as done conventionally considering inflowing of the melted seal layer 270. Thus, the MEMS switch 20 can be made smaller.

Figure 10D:
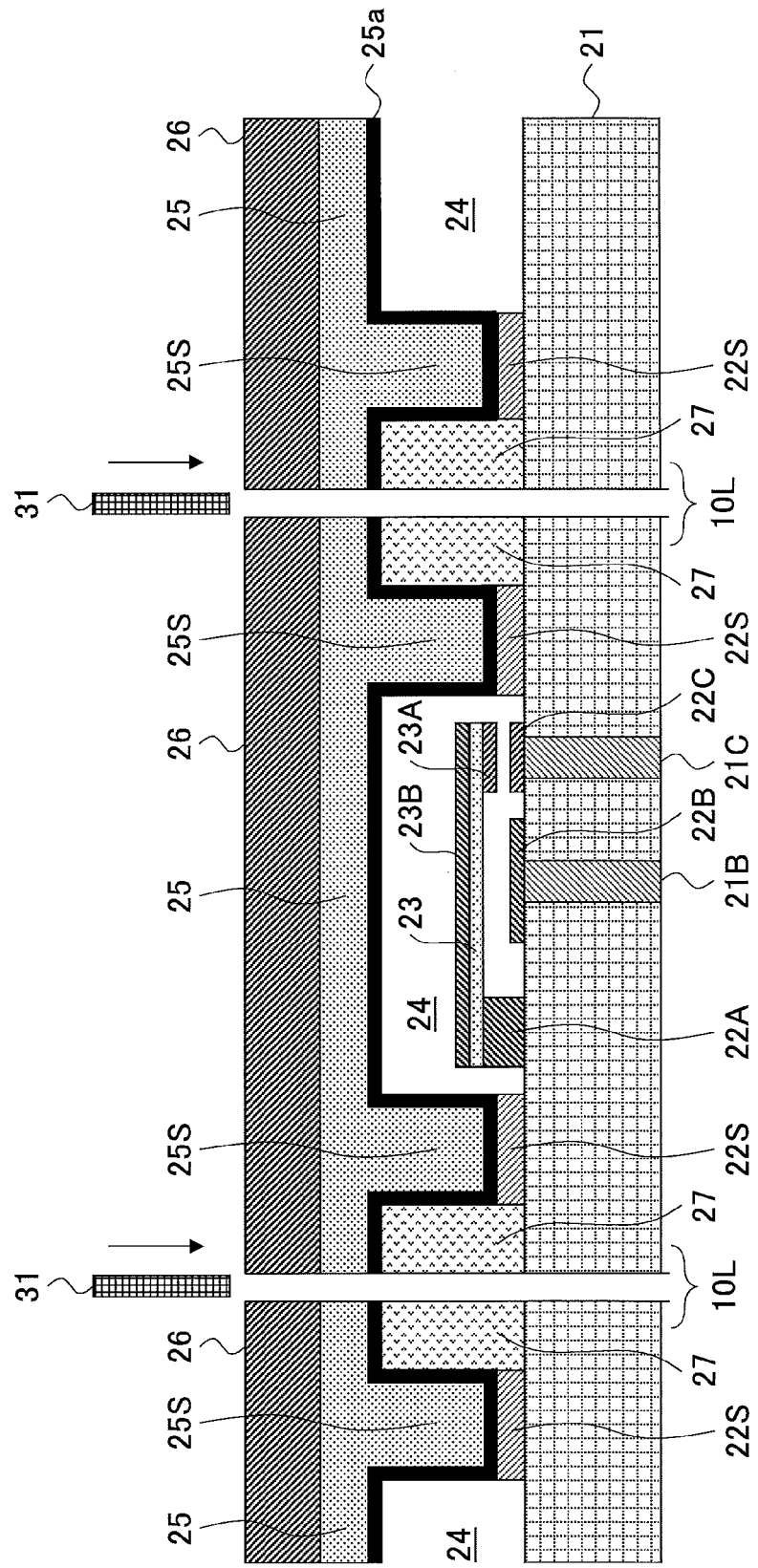
FIG. 10D is another fourth process cross-sectional view illustrating the wafer level packaging according to the first embodiment.

Further, after the melted seal layer 270 is solidified, for example, by having dicing blades 31 work on the wafer 10 along the scribe lines 10L in a direction designated by arrows as illustrated in FIG. 9D and FIG. 10D, the wafer 10 is divided into individual element forming regions, and MEMS switches 20 are obtained as described in FIG. 1.

Further, FIGS. 11A-11D are process cross-sectional views illustrating a manufacturing method of the cap substrate 250.

Figure 11A:
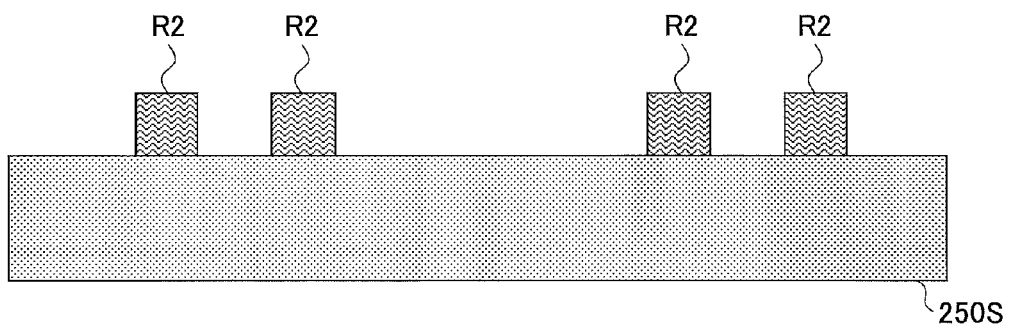
FIG. 11A is a first cross-sectional view illustrating a forming process of a cap substrate according to the first embodiment.
Figure 11B:
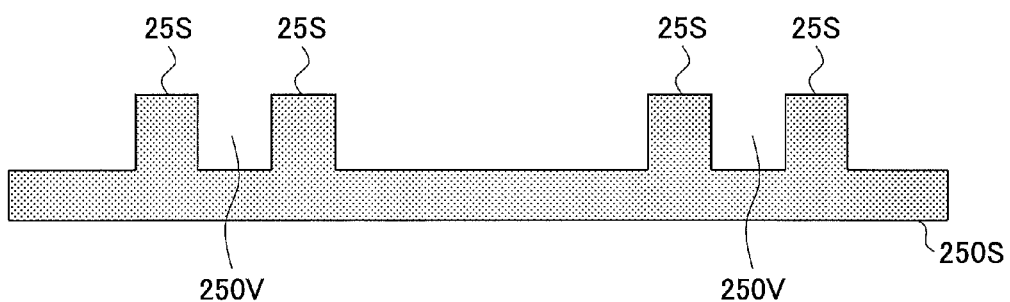
FIG. 11B is a second cross-sectional view illustrating the forming process of the cap substrate according to the first embodiment.

Referring to FIG. 11A, for example, a photoresist pattern R2 is formed on a silicon substrate 250S that has been formed in a square shape corresponding to the wafer 10 where the photoresist pattern R2 corresponds to the sidewall member 25S illustrated in the plan view of FIG. 8B. As illustrated in FIG. 11B, then, the silicon substrate 250S is etched using the photoresist pattern R2 as a mask, by a predetermined depth corresponding to the height of the operational space 24, for example, 50 μm. The etching forms the sidewall members 25S on the silicon substrate 250S, which forms the spaces 250V between an element forming region and its adjacent element forming regions partitioned by the sidewall members 25S.

Figure 11C:
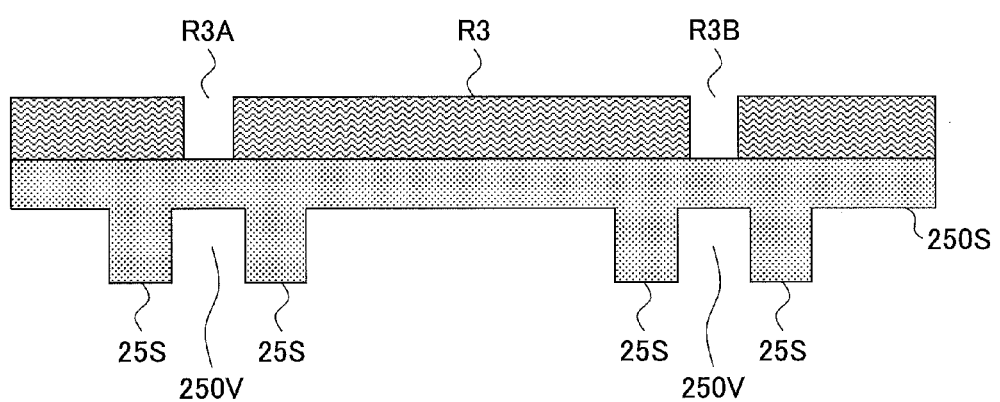
FIG. 11C is a third cross-sectional view illustrating the forming process of the cap substrate according to the first embodiment.
Figure 11D:
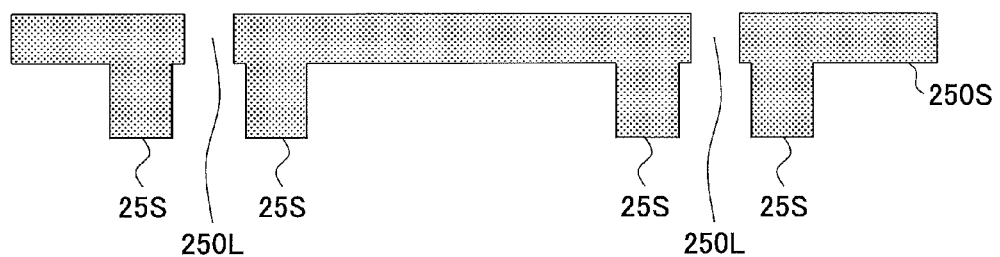
FIG. 11D is a fourth cross-sectional view illustrating the forming process of the cap substrate according to the first embodiment.

Further, as illustrated in FIG. 11C, the silicon substrate 250S in a state of FIG. 11B is flipped upside down, then, a photoresist pattern R3 is formed on the upper surface that includes photoresist openings R3A and R3B corresponding to slit parts 250L. Further, the silicon substrate 250 is etched using the photoresist pattern R3 as a mask as illustrated in FIG. 11D, which forms the slit parts 250L that communicate with the spaces 250V.

Figure 11E:
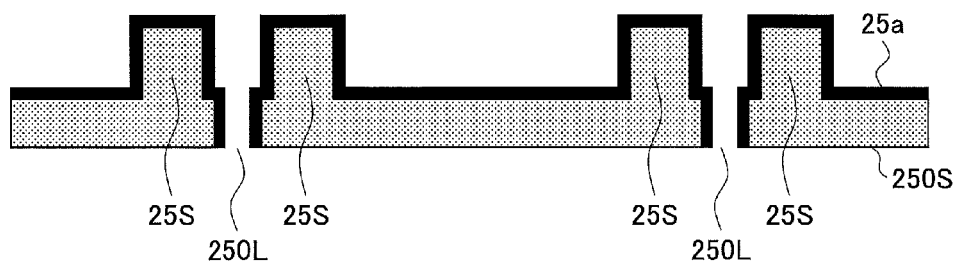
FIG. 11E is a fifth cross-sectional view illustrating the forming process of the cap substrate according to the first embodiment.

Note that the process may be applied on the surface where the spaces 250V are formed without flipping the substrate 250S upside down. Further, the silicon substrate 250S in a state of FIG. 11D is flipped upside down as illustrated in FIG. 11E, then, an adhesion layer 25a is formed on the surface where the sidewall members 25S are formed, with the film thickness of, for example, 0.5 μm, and thus, the cap substrate 250 is formed.

As above, the cap substrate 250 is formed of the silicon substrate 250S in the present embodiment, and the cover member 25 is also formed of silicon. However, the present embodiment is not limited to such a specific material, but materials other than silicon such as glass, metal, or ceramics can be used to form the cap substrate 250 and the cover member 25.

Figure 12:
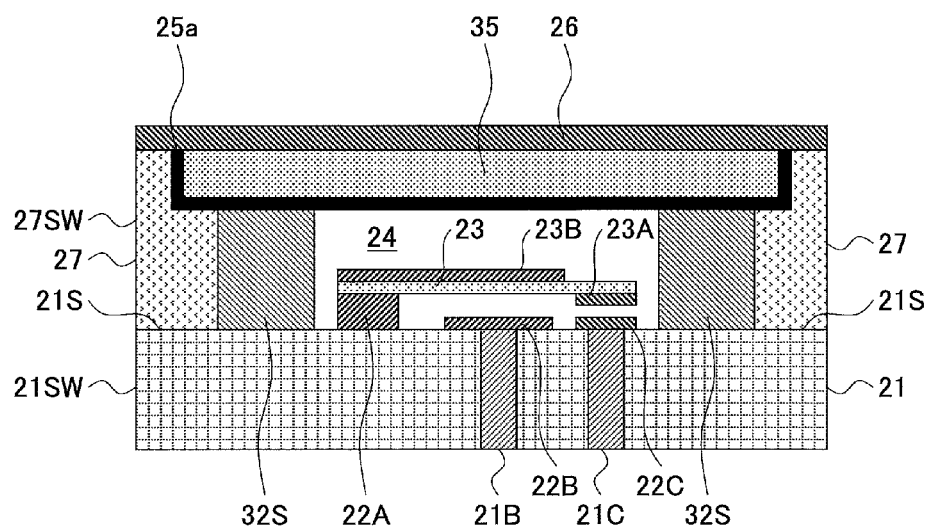
FIG. 12 is a cross-sectional view illustrating a MEMS switch according to a modified example of the first embodiment.

FIG. 12 is a cross-sectional view illustrating a MEMS switch 20A according to a modified example of the present embodiment. Parts corresponding to the previous embodiments are assigned the same numerical codes in FIG. 12, and their description is omitted.

Referring to FIG. 12, according to the present embodiment, instead of the seal ring 22S, a seal ring 32S that has the height corresponding to the height of the operational space 24 is formed of, for example, copper by electrolytic plating, on which a plate-shaped cover member 35 is bonded to partition the operational space 24. The plate-shaped cover member 35 is made of, for example, silicon, and has substantially the same configuration as the previously described cover member 35 made of silicon, but lacks the sidewall part 25S and has a flat lower surface.

An adhesion layer 25a is formed on the lower surface and sidewall surface of the cover member 35, and the cover member 35 is solidly bonded to the surface 21S of the substrate 21 via a seal member such as solder at the outside of the seal ring 32S that constitutes a sidewall member.

In the example in FIG. 12, the shield layer 26 has an external form that corresponds with the external form of the substrate 21, the sidewall surface of the cover member 35 partitioning its circumference is formed at a position receding from the sidewall surface of the shield layer 26 partitioning its circumference, and the sidewall surface of the seal ring 32S partitioning its circumference is formed at a position further receding from the sidewall surface of the shield layer 26. Therefore, two step parts are formed in the configuration as illustrated in FIG. 12. The solder of the seal member 27 fills both of the two step parts in the embodiment in FIG. 12. Consequently, the cover member 35 is solidly bonded to the surface of the substrate 21.

The configuration in FIG. 12 can be similarly formed using a substrate having a flat lower surface on which the sidewall member 25S is not formed, as the cap substrate 250 illustrated in the plan view of FIG. 8B for the wafer level packaging described with FIG. 6, and by performing the processes of FIGS. 9A-9D and FIGS. 10A-10D.

Figure 13:
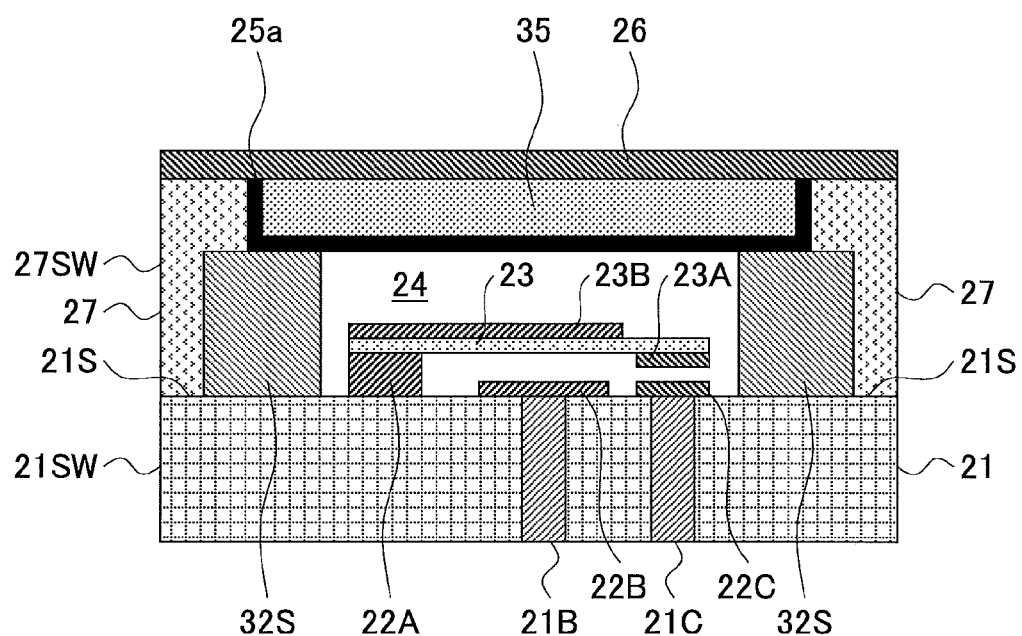
FIG. 13 is a cross-sectional view illustrating a MEMS switch according to another modified example of the first embodiment.

FIG. 13 is a cross-sectional view illustrating a MEMS switch 20A according to another modified example of the present embodiment. Note that parts corresponding to the previous embodiments are assigned the same numerical codes in FIG. 13, and their description is omitted.

In the modified example in FIG. 13, it should be noted that the sidewall surface of the cover member 35 partitioning its circumference is formed at a position receding from both the sidewall surface of the shield layer 26 partitioning its circumference that corresponds to the circumference of the substrate 21, and the sidewall surface of the sidewall member 32S (also used as a seal ring) partitioning its circumference.

Configured in this way, in the modified example in FIG. 13, a step part is formed as illustrated in FIG. 13, the seal member 27 fills the step part, and the shield layer 26 is solidly bonded to the surface of the substrate 21 by the seal member 27. Consequently, the cover member 35 is also solidly bonded to the surface of the substrate 21 in the modified example in FIG. 13.

Also in the configuration in FIG. 13, the dimensions of the cover member 35 are reduced, and the MEMS switch 20B can be made further smaller.

Second Embodiment

Figure 14:
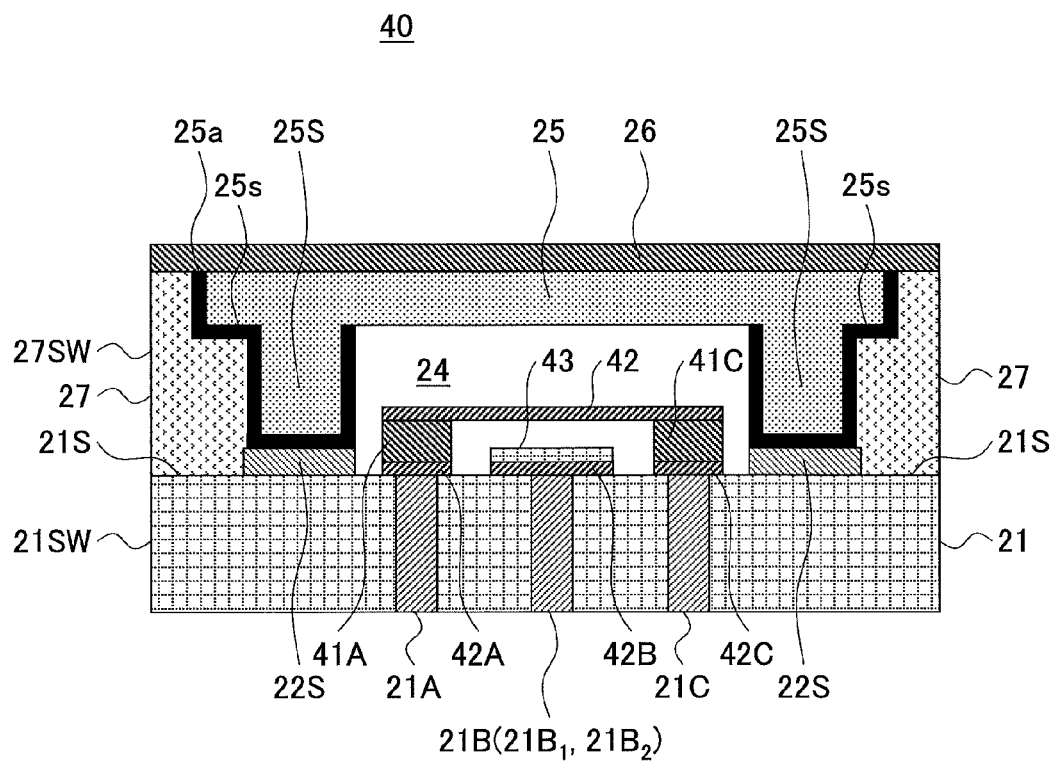
FIG. 14 is a cross-sectional view illustrating a configuration of a variable capacitance element according to a second embodiment.
Figure 15:
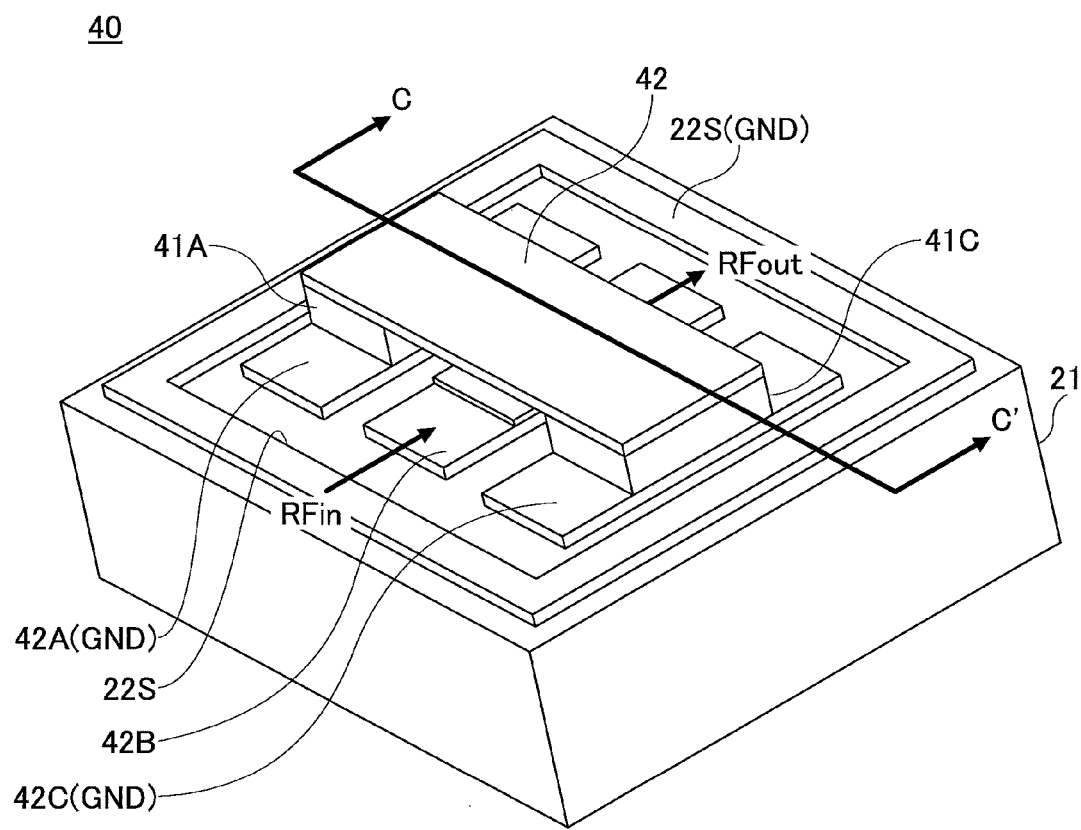
FIG. 15 is a perspective view illustrating a main body part of the variable capacitance element in FIG. 14.

FIG. 14 is a cross-sectional view illustrating a configuration of a variable capacitance element 40 according to the second embodiment, and FIG. 15 is a perspective view illustrating a configuration of a main body part of the variable capacitance element 40 in FIG. 14. The cross-sectional view of FIG. 14 is a cross-sectional view taken along the line C-C' in the perspective view of FIG. 15. Parts corresponding to the previously described parts are assigned the same numerical codes in FIG. 14, and their description is omitted.

Referring to the cross-sectional view of FIG. 14, in the present embodiment, on an element forming region of the wafer 10 that corresponds to a substrate 21, instead of the pillar 22A and the electrode pattern 22C, ground electrode patterns 42A and 42C are formed of gold, on which pillars 41A and 41C are formed of copper with the height of, for example, 2 μm, respectively. Also, between the pillars 41A and 41C, an upper electrode pattern 42 is formed of a gold film with the film thickness of, for example, 1 μm that has an airbridge structure. Further, between the ground electrode patterns 42A and 42C on the substrate 21, a lower electrode pattern 42B is formed that faces the upper electrode 42.

In the configuration in FIG. 14, the upper electrode pattern 42 can change its displacement relative to the facing lower electrode pattern 42B, and the upper electrode pattern 42 and the lower electrode pattern 42B constitute a variable capacitance element. To avoid short-circuit between the upper electrode pattern 42 and the lower electrode pattern 42B, a capacitor dielectric film 43 made of a silicon dioxide film or the like is formed on the lower electrode pattern 42B.

Referring to the perspective view of FIG. 15, the seal ring 22S partitions the element forming region on the substrate 21 similarly to the previous embodiment, the lower electrode pattern 42B extends on the surface 21S of the substrate 21 from a high-frequency signal input side (RFin) to a high-frequency signal output side (RFout), under the upper electrode pattern 42. In the substrate 21, via plugs $21B_1$ and $21B_2$ illustrated in the cross-sectional view of FIG. 14 are also formed corresponding to the input side and the output side respectively. The seal ring 22S and the electrode patterns 42A and 42C are grounded (GND) by through via plugs 21A and 21C formed in the substrate 21, respectively. Configured in this way, the variable capacitance element 40 has a high frequency transmission line formed by the lower electrode pattern 42B, to which capacitance Ccap is connected that is formed between the upper electrode pattern 42 and the lower electrode pattern 42B, as illustrated in FIG. 16C.

Figure 16A:
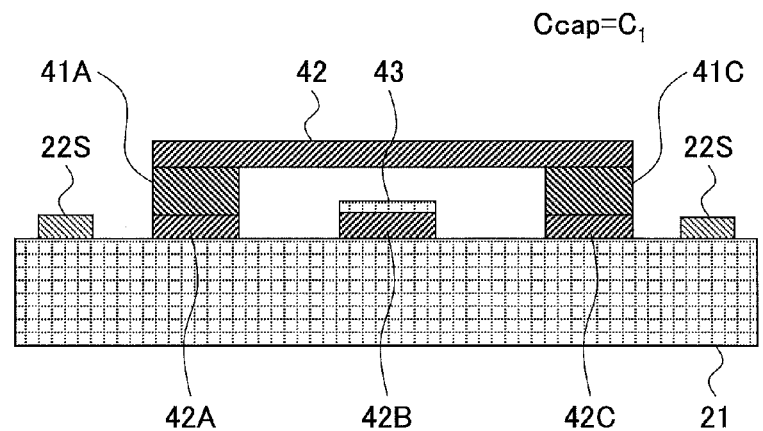
FIG. 16A is a schematic view illustrating a first operational state of the variable capacitance element in FIG. 14.
Figure 16B:
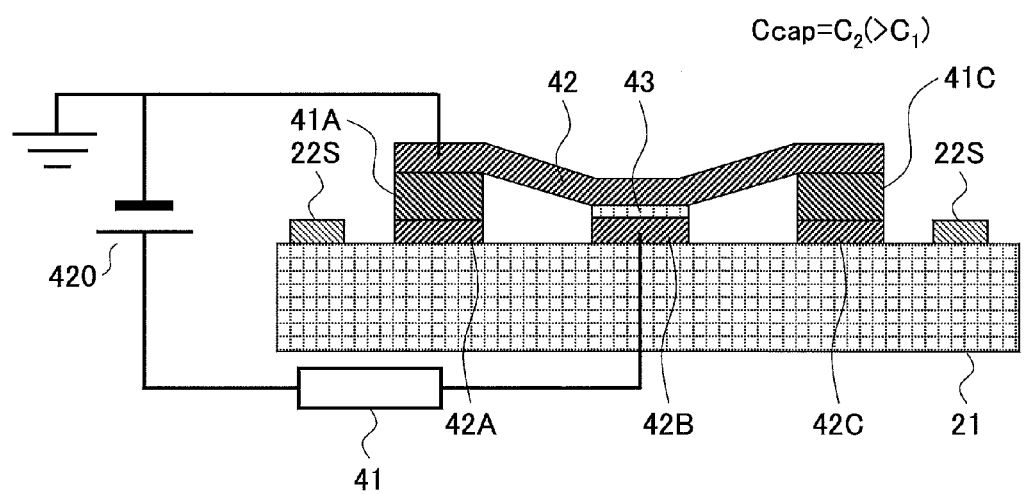
FIG. 16B is a schematic view illustrating a second operational state of the variable capacitance element in FIG. 14.
Figure 16C:
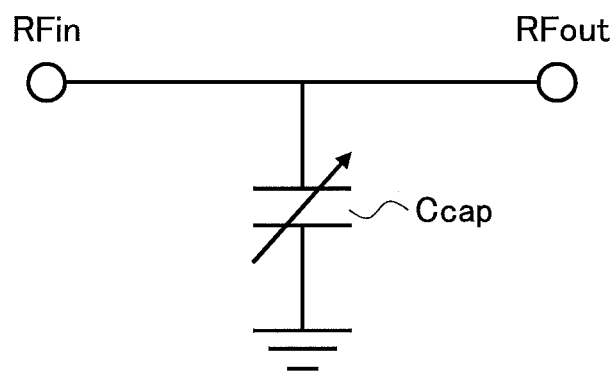
FIG. 16C is an equivalent circuit diagram of the variable capacitance element in FIG. 14.

FIGS. 16A-16B are schematic views illustrating operation of the variable capacitance element 40.

Referring to FIG. 16A, if a DC voltage is not applied to the lower electrode pattern 42B from an external DC voltage source, no electrostatic force is generated between the upper electrode pattern 42 and the lower electrode pattern 42B, both are separated, and the capacitance Ccap takes a first value C1.

On the other hand, as illustrated in FIG. 16B, if a DC voltage is applied between the upper electrode pattern 42 and the lower electrode pattern 42B from a DC voltage source 420 via a high frequency cutoff circuit 41 including a shunt capacitor, the upper electrode pattern 42 is pulled towards the lower electrode pattern 42B by electrostatic force, and in an extremity, contacts the lower electrode pattern 42B via the capacitor dielectric film 43. In such a state, the capacitance Ccap takes a second value C2, which is greater than the first value C1.

In this way, the variable capacitance element 40 can change the capacitance of the capacitor connected to the transmission line of a high-frequency signal constituted with the lower electrode pattern 42B, by applying a DC voltage between the upper electrode 42 and the lower electrode 42B as illustrated in the equivalent circuit diagram in FIG. 16C according to the present embodiment.

In the present embodiment, it should be noted that the adhesion layer 25a having an Au/Ti stack structure is partially removed on the cover member 25 at a part facing the substrate 21 in the operational space 24, as illustrated in the cross-sectional view of FIG. 14. Configured in this way, when a high-frequency signal is supplied to the electrode pattern, parasitic capacitance is not generated between the electrode pattern and the cover member 25 on the substrate 21, which suppresses an influence of parasitic capacitance on the operation of the variable capacitance element 40.

In the following, a manufacturing method of the variable capacitance element 40 in FIG. 14 will be described.

First, manufacturing of the main body part of the variable capacitance element 40 will be briefly described with reference to FIGS. 17A-17I.

Figure 17A:
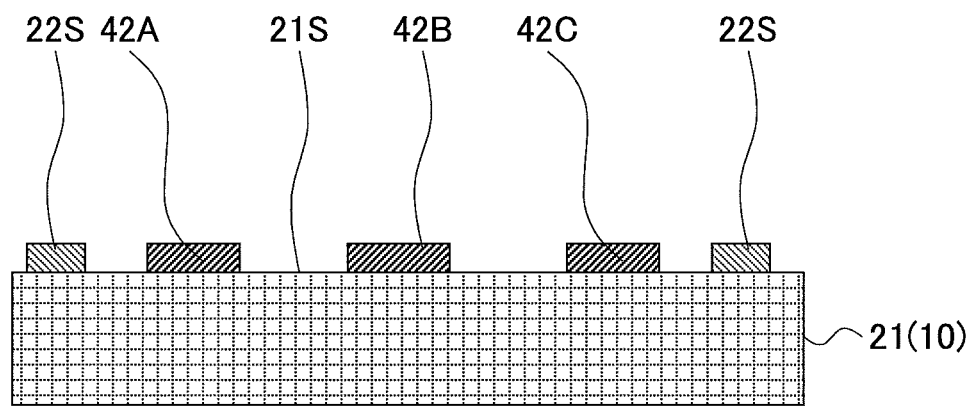
FIG. 17A is a first process cross-sectional view illustrating a forming process of the main body part of the variable capacitance element in FIG. 14.

Referring to FIG. 17A, first, at each of the element forming regions 10A, 10B, 10C, etc., on the wafer 10 in FIG. 2, a seal ring 22S, ground electrode patterns 42A and 42C, and a lower electrode pattern 42B are formed on the surface 21S of the substrate 21 that corresponds to the wafer 10, for example, by accumulating and patterning a gold film with the thickness of, for example, 1 μm. Here, a seal ring 22S is formed, similarly to the previous embodiment, having the width of, for example, 150 μm along the scribe lines 10L that partition the element forming regions having the dimensions of, for example, 1500 μm by 1000 μm, respectively. As described earlier, the seal ring 22S is formed with a ring shape continuously surrounding a structure to be formed in the element forming region including the electrode patterns 42A-42C and the like.

Also in the present embodiment, a thin gold film (not illustrated) is formed as a plating seed layer on the surface 21S of the substrate 21, or the surface of the wafer 10, on which the seal ring 22S and the electrode patterns 42A-42C are formed by an electrolytic plating method using a photoresist pattern as a mask that has photoresist openings corresponding to the electrode patterns 42A-42C, respectively.

Figure 17B:
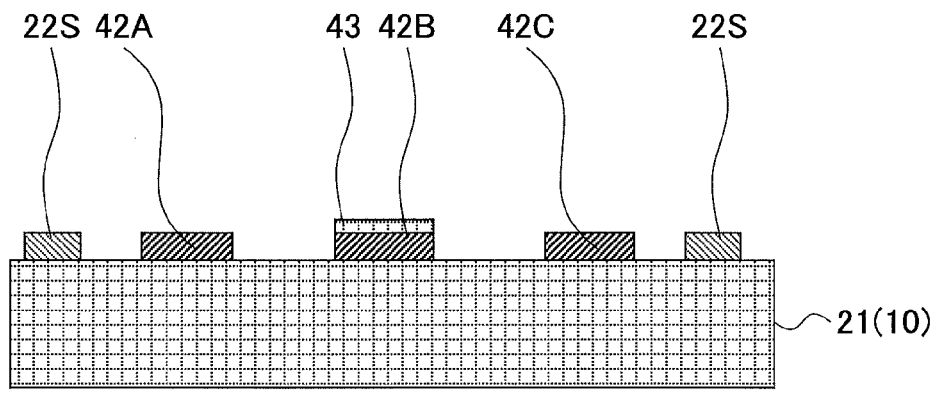
FIG. 17B is a second process cross-sectional view illustrating the forming process of the main body part of the variable capacitance element in FIG. 14.

Next, a dielectric film such as a silicon dioxide film is formed on the substrate 21 by the process of FIG. 17B, to which patterning is applied by a photoresist process (not illustrated), and thus a capacitor insulation film 43 is formed of, for example, a silicon dioxide film on the lower electrode pattern 42B as illustrated in FIG. 17B.

Figure 17C:
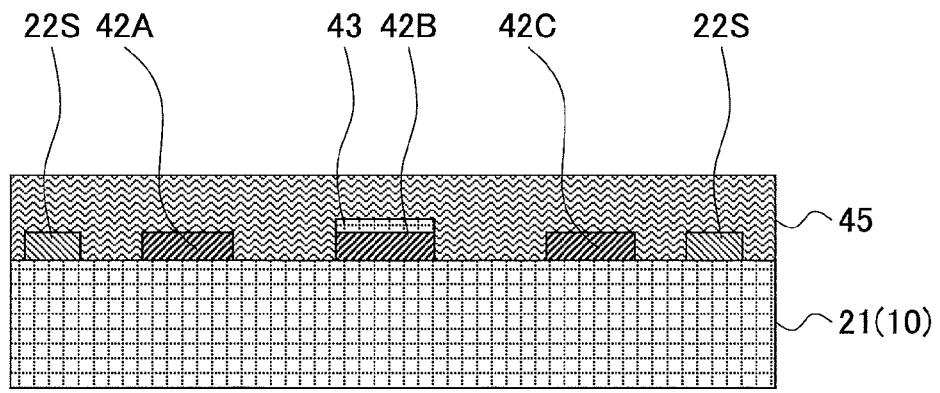
FIG. 17C is a third process cross-sectional view illustrating a forming process of the main body part of the variable capacitance element in FIG. 14.
Figure 17D:
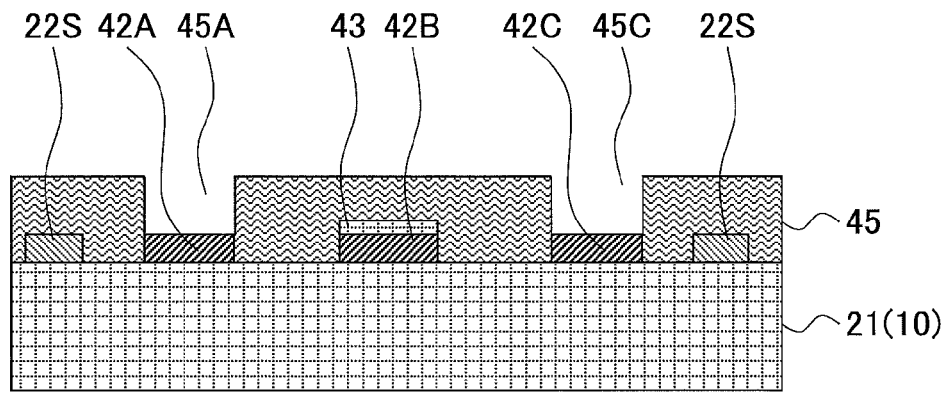
FIG. 17D is a fourth process cross-sectional view illustrating a forming process of the main body part of the variable capacitance element in FIG. 14.

Further, by a process of FIG. 17C, a photoresist film 45 is formed covering the seal ring 22S and electrode patterns 42A-42C on the substrate 21, and further, as illustrated in FIG. 17D, openings 45A and 45C are formed in the photoresist film 45 to expose the ground electrode patterns 42A and 42C, respectively.

Figure 17E:
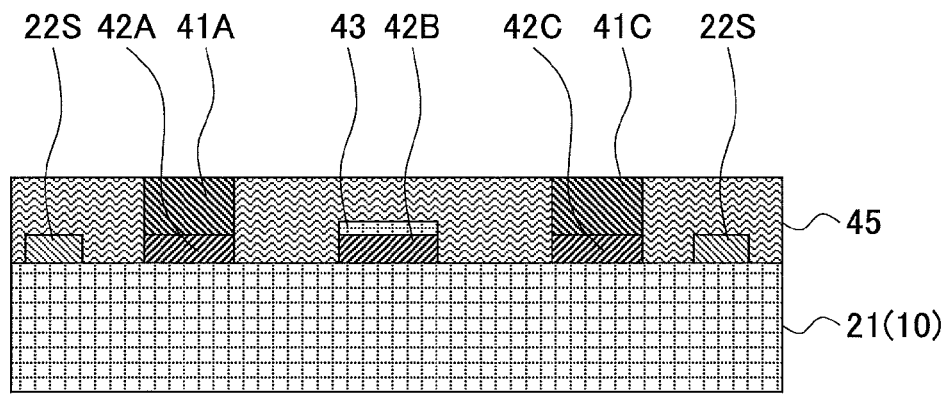
FIG. 17E is a fifth process cross-sectional view illustrating a forming process of the main body part of the variable capacitance element in FIG. 14.

Further, by a process of FIG. 17E, using the photoresist film 45 as a mask, a copper film is formed that fills the photoresist openings 45A and 45C on the ground electrode patterns 42A and 42C, with which a pillar 41A is formed of copper on the ground electrode pattern 42A, and a pillar 41C is formed of copper on the ground electrode pattern 42C, by an electrolytic plating method, respectively. Note that when forming the pillars 41A and 41C by the electrolytic plating, the gold film that has been formed on the surface of the wafer 10 by the process of FIG. 17A can be used as a plating seed layer.

Figure 17F:
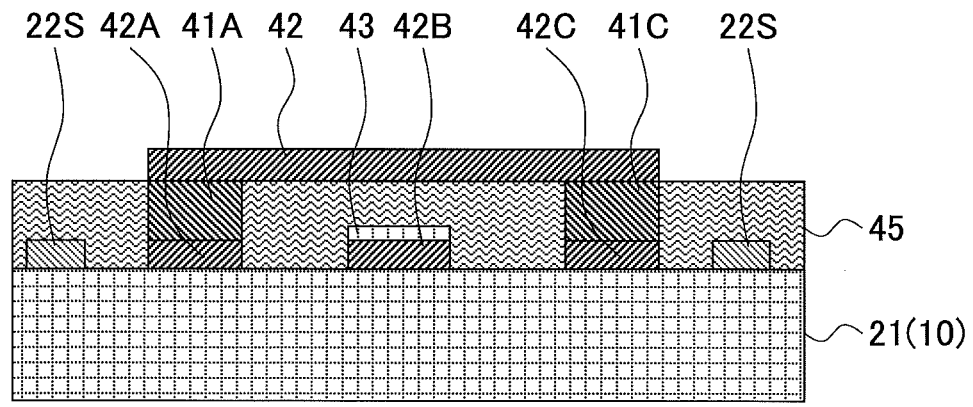
FIG. 17F is a sixth process cross-sectional view illustrating the forming process of the main body part of the variable capacitance element in FIG. 14.
Figure 17G:
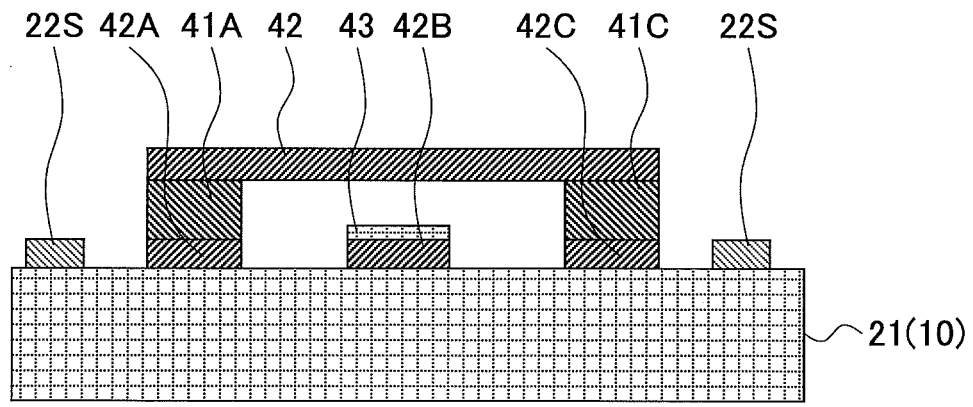
FIG. 17G is a seventh process cross-sectional view illustrating the forming process of the main body part of the variable capacitance element in FIG. 14.

Further, by a process of FIG. 17F, a gold film is formed on the photoresist film 45 by, for example, a low-temperature process such as sputtering, to which patterning is applied, and thus, an upper electrode pattern 42 is formed that bridges the pillars 41A and 41C.

Further, the photoresist film 45 is removed by dissolving with a solvent or the like or by asking in an oxygen atmosphere as illustrated in FIG. 17F, and thus the variable capacitance element 40 in FIG. 14 is formed.

Further, if the seal ring 22S, the electrode patterns 22B-22C, and the like have been formed by using an electrolytic plating method in the process of FIG. 17A, the thin plating seed layer that has been formed and remains on the surface of the wafer 10 is removed by wet etching after removing the photoresist film 45.

Thus, by the processes of FIGS. 17A-17G, the main body part of the variable capacitance element 40 is formed in every one of the element forming regions 10A, 10B, 10C, etc., on the wafer 10 in FIG. 2, which is illustrated in the perspective view of FIG. 15.

Note that it is assumed that the through via plugs 21A-21C and the like have been already formed in the substrate 21 before the process of FIG. 17A.

Further, by applying a wafer level package process described with FIG. 6, FIG. 7, FIGS. 8A-8B, FIGS. 9A-9D, and FIGS. 10A-10D, to the wafer 10 having the variable capacitance elements 40 formed in the element forming regions 10A, 10B, 10C, etc., the variable capacitance elements 40 illustrated in FIG. 14 are completed.

Here, it should be noted that the adhesion layer 25a is removed on the lower surface of the cover member 25 made of silicon to reduce parasitic capacitance in the variable capacitance element 40 according to the present embodiment.

Figure 18A:
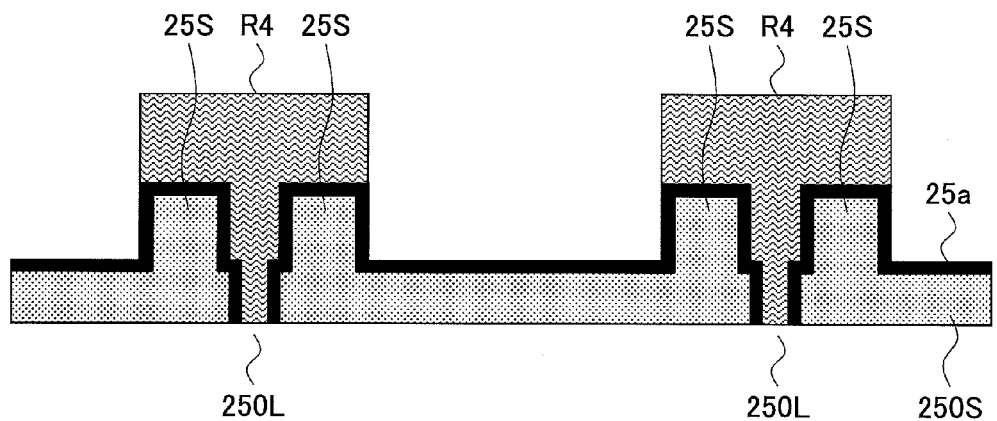
FIG. 18A is a first cross-sectional view illustrating a forming process of a cap substrate according to the second embodiment.
Figure 18B:
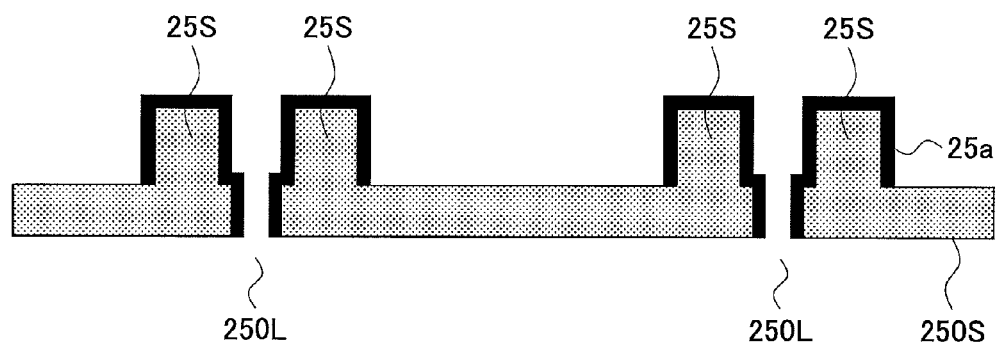
FIG. 18B is a second cross-sectional view illustrating the forming process of the cap substrate according to the second embodiment.

Therefore, in the present embodiment, when producing the cap substrate 250 by the processes described with FIGS. 11A-11E, processes of FIGS. 18A-18B are further applied following the process of FIG. 11E, to remove the adhesion layer 25a on the cover member 25 at a part where the cover member 25 faces the surface 21S of the substrate 21 when the cover member 25 is mounted on the substrate 21.

Namely, in the process of FIG. 18A, a photoresist pattern R4 is formed covering the slit parts 250L and the sidewall members 25S on the cap substrate 250 made of the silicon substrate 250S, further, using the photoresist pattern R4 as a mask; the adhesion layer 25a exposed on the silicon substrate 250S is removed by, for example, sputter etching or wet etching.

Then, as illustrated in FIG. 18B, the photoresist pattern R4 is removed, and thus a structure that has the adhesion layer 25a partially removed on the surface facing the substrate 21 in each of the cover members 25 is obtained as the cap substrate 250.

Using such a cap substrate 250, the variable capacitance element 40 is obtained that has the structure described with FIG. 14.

In the present embodiment, the cover member 25, or the cap substrate 250, is not limited to be formed of silicon, but insulation materials other than silicon such as glass, metal, or ceramics can be used. Also, if the cover member 25, or the cap substrate 250, is formed of silicon, it is preferable to use an insulation silicon substrate having the specific resistance of greater than or equal to 1000 Ω·cm. Using such a material having insulation properties for the cover member 25, effect of parasitic capacitance by the cover member 25 can be reduced in the variable capacitance element 40 having the configuration of FIG. 14.

Figure 19:
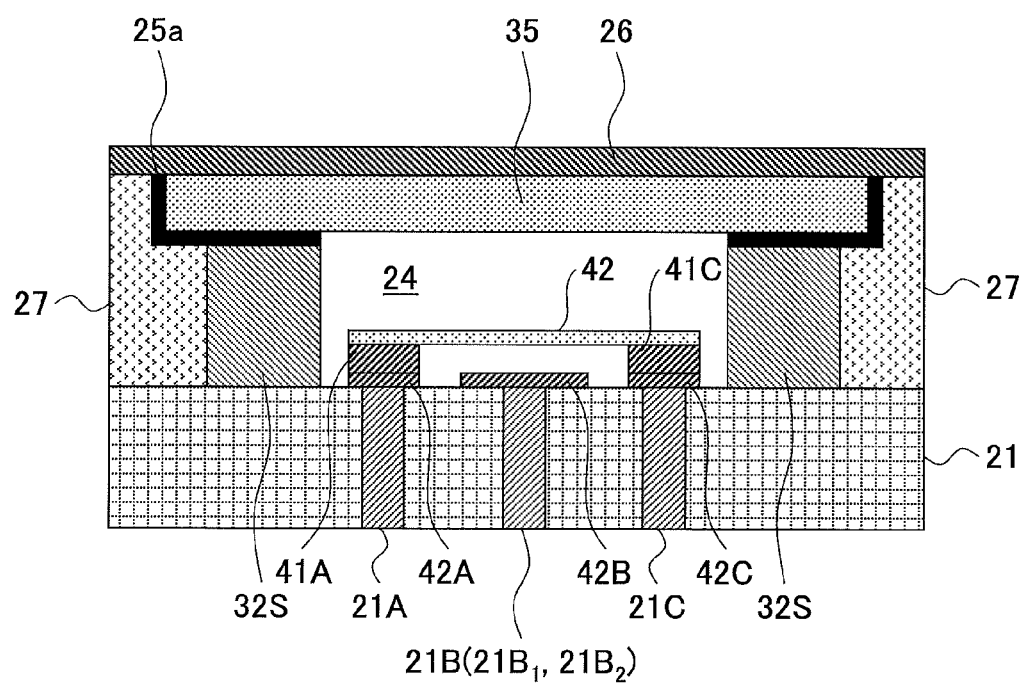
FIG. 19 is a cross-sectional view illustrating a variable capacitance element according to a modified example of the second embodiment.

FIG. 19 is a cross-sectional view illustrating a configuration of a variable capacitance element 40A according to a modified example of the present embodiment. Note that parts corresponding to the previous embodiments are assigned the same numerical codes in FIG. 19, and their description is omitted.

Referring to FIG. 19, according to the present embodiment, instead of the seal ring 22S, a seal ring 32S that has the height corresponding to the height of the operational space 24 is formed of, for example, copper by electrolytic plating as corresponding to the embodiment in FIG. 12, on which a plate-shaped cover member 35 is bonded to partition the operational space 24. The plate-shaped cover member 35 is made of, for example, silicon, and has substantially the same configuration as the previously described cover member 35 also made of silicon, but lacks the sidewall part 25S, and has a flat lower surface.

An adhesion layer 25a is formed on the lower surface and sidewall surface of the cover member 35, with which the cover member 35 is solidly bonded to the surface 21S of the substrate 21 via a seal member 27 such as solder at the outside of the seal ring 32S that constitutes a sidewall member.

In the example in FIG. 19, the shield layer 26 has an external form that corresponds to the external form of the substrate 21, the sidewall surface of the cover member 35 partitioning its circumference is formed at a position receding from the sidewall surface of the shield layer 26 partitioning its circumference, and the sidewall surface of the seal ring 32S partitioning its circumference is formed at a position further receding from the sidewall surface of the shield layer 26. Therefore, two step parts are formed with the configuration as illustrated in FIG. 19. The solder of the seal member 27 fills both of the two step parts in the embodiment in FIG. 19. Consequently, the cover member 35 is solidly bonded to the surface of the substrate 21.

The configuration in FIG. 19 can be similarly formed using a substrate having a flat lower surface on which the sidewall member 25S is not formed, as the cap substrate 250 illustrated in the plan view of FIG. 8B for the wafer level packaging described with FIG. 6, and by performing the processes of FIGS. 9A-9D and FIGS. 10A-10D.

Figure 20:
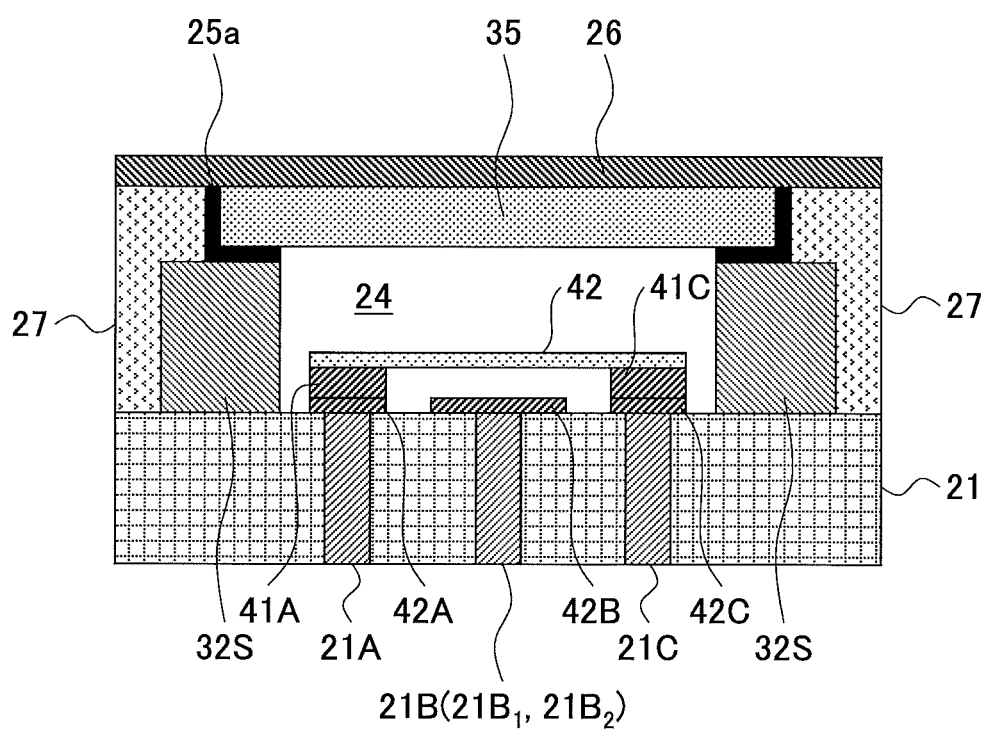
FIG. 20 is a cross-sectional view illustrating a variable capacitance element according to another modified example of the second embodiment.

FIG. 20 is a cross-sectional view illustrating a variable capacitance element 40B according to another modified example of the present embodiment. Note that parts corresponding to the previous embodiments are assigned the same numerical codes in FIG. 20, and their description is omitted.

In the modified example in FIG. 20, it should be noted that the sidewall surface of the cover member 35 partitioning its circumference is formed at a position receding from both of the sidewall surface of the shield layer 26 partitioning its circumference that corresponds to the circumference of the substrate 21, and the sidewall surface of the sidewall member 32S partitioning its circumference where the sidewall member 32S is used as a seal ring.

Configured in this way, in the modified example in FIG. 20, a step part is formed as illustrated in FIG. 20, the seal member 27 fills the step part, and the shield layer 26 is solidly bonded to the surface of the substrate 21 by the seal member 27. Consequently, the cover member 35 is also solidly bonded to the surface of the substrate 21 in the modified example in FIG. 20.

Also in the configuration in FIG. 20, the dimensions of the cover member 35 are reduced, and the MEMS switch 40B can be made further smaller.

Note that the seal member 27 is not restricted to be made of solder, but may be made of, for example, resin, in the embodiments described above. The electronic devices can be made lighter by using resin for the seal member 27.

Further, in the embodiments described above, an element formed in the operational space 24 is not limited to a MEMS switch or a variable capacitance element, but a crystal oscillator or the like may be formed, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
a substrate;
an element configured to be formed on the substrate;
a sidewall member configured to enclose the element on the substrate;
a cover member configured to be disposed on the sidewall member, and to partition a space around the element along with the sidewall member on the substrate; and
a seal member configured to be disposed outside of the sidewall member, to bond the sidewall member and the cover member to a surface of the substrate, and to seal the space,
wherein the cover member is a plate-shaped member being bonded to the sidewall member,
a shield member is formed on the cover member with a circumference having a same form as the circumference of the substrate,
the cover member has a circumference partitioned by a sidewall surface at a position receding from the sidewall surface partitioning the circumference of the shield member,
the sidewall member partitioning the circumference of the sidewall surface is formed at a position receding from both the sidewall surface partitioning the circumference of the shield member, and the sidewall surface partitioning the circumference of the cover member, to form a step part, and
the seal member fills the step part.

2. The electronic device as claimed in claim 1, wherein the substrate is partitioned by a sidewall surface at a circumference of the substrate, the seal member is partitioned by a sidewall surface at a circumference of the seal member, where the sidewall surface at the circumference of the seal member coincides with an extended surface of the sidewall surface at the circumference of the substrate.

3. The electronic device as claimed in claim 1, wherein the cover member and the sidewall member constitute a member having a unified form, and the sidewall member is bonded to a seal ring enclosing the element on the surface of the substrate.

4. The electronic device as claimed in claim 1, wherein the cover member is a plate-shaped member being bonded to the sidewall member.

5. The electronic device as claimed in claim 4, wherein the sidewall member constitutes a part of the seal ring enclosing the element on the substrate.

6. The electronic device as claimed in claim 1, wherein the cover member and the sidewall member contact the seal member via an adhesion layer including a titanium layer.

7. The electronic device as claimed in claim 6, wherein the sidewall member is bonded to a seal ring enclosing the element on the substrate via the adhesion layer, and the seal ring is made of metal.

8. The electronic device as claimed in claim 6, wherein the adhesion layer is not formed on the cover member at a part facing the substrate in the space.

9. The electronic device as claimed in claim 1, wherein the element is a variable capacitance element provided with an electrode constituting a movable member.

10. The electronic device as claimed in claim 1, wherein the seal member is solder or resin.

11. An electronic device comprising:
a substrate;
an element configured to be formed on the substrate;
a sidewall member configured to enclose the element on the substrate;
a cover member configured to be disposed on the sidewall member, and to partition a space around the element along with the sidewall member on the substrate; and
a seal member configured to be disposed outside of the sidewall member, to bond the sidewall member and the cover member to a surface of the substrate, and to seal the space,
wherein the cover member is a plate-shaped member being bonded to the sidewall member,
a shield member is formed on the cover member with a circumference having a same form as the circumference of the substrate,
the sidewall member has a circumference partitioned by a sidewall surface at a position receding from the sidewall surface partitioning the circumference of the shield member,
the sidewall member partitioning the circumference of the cover member is formed at a position receding from both the sidewall surface partitioning the circumference of the shield member, and the sidewall surface partitioning the circumference of the sidewall member, to form a step part, and
the seal member fills the step part.

12. A manufacturing method of an electronic device, the method comprising:
forming a plurality of elements in a matrix shape on a wafer;
producing a cap substrate having a state where
a plurality of cover members are formed in a matrix shape corresponding to the plurality of elements,
a sidewall part is included in each of the cover members to enclose each of the corresponding elements,
the cover members adjacent to each other are mutually separated by groove members, and
the cover members adjacent to each other are mutually bonded by bridge members bridging the groove members;
placing the cap substrate on the wafer so that each of the cover members encloses the corresponding element by a sidewall part;
filling spaces between the sidewall members adjacent to each other under a shield substrate with a seal member, by pressing the shield substrate supporting a seal layer in a flexible state onto the cap substrate so that the seal layer is pressed to outside of each of the sidewall parts enclosing the element via the groove members, to be solidified; and
separating the plurality of elements into individual electronic devices by cutting off the shield substrate, the cap substrate, and the wafer along the groove members.

13. The manufacturing method of an electronic device, as claimed in claim 12, wherein the forming of the plurality of elements in the matrix shape on the wafer includes forming a plurality of seal rings enclosing the plurality of elements, respectively, and
the placing of the cap substrate on the wafer is performed so that the sidewall parts are engaged with the seal rings enclosing the corresponding elements.

14. A manufacturing method of an electronic device, the method comprising:
forming a plurality of elements in a matrix shape on a wafer;

forming a plurality of sidewall members as seal rings enclosing the plurality of elements, respectively, the sidewall members rising on a surface of the wafer;

producing a cap substrate having a state where
- a plurality of cover members are formed in a matrix shape corresponding to the plurality of elements,
- the cover members adjacent to each other are mutually separated by groove members, and
- the cover members adjacent to each other are mutually bonded by bridge members bridging the groove members;

placing the cap substrate on the wafer so that each of the cover members covers the corresponding element, and engages with the corresponding sidewall member;

filling spaces between the sidewall members adjacent to each other under a shield substrate with a seal member, by pressing the shield substrate supporting a seal layer in a flexible state onto the cap substrate so that the seal layer is pressed to outside of each of the sidewall members enclosing the element via the groove members, to be solidified; and separating the plurality of elements into individual electronic devices by cutting off the shield substrate, the cap substrate, and the wafer along the groove members.

* * * * *